United States Patent
Hagihara

(10) Patent No.: US 8,587,689 B2
(45) Date of Patent: Nov. 19, 2013

(54) TIME AD CONVERTER AND SOLID STATE IMAGE PICKUP DEVICE

(75) Inventor: Yoshio Hagihara, Tokyo (JP)

(73) Assignees: Olympus Corporation, Tokyo (JP); Denso Corporation, Kariya-shi, Aichi (JP)

( * ) Notice: Subject to any disclaimer, the term of this patent is extended or adjusted under 35 U.S.C. 154(b) by 0 days.

(21) Appl. No.: 13/343,129

(22) Filed: Jan. 4, 2012

(65) Prior Publication Data

US 2012/0105694 A1 May 3, 2012

Related U.S. Application Data

(63) Continuation of application No. PCT/JP2010/061646, filed on Jul. 8, 2010.

(30) Foreign Application Priority Data

Jul. 16, 2009 (JP) .................................. 2009-168013

(51) Int. Cl.
*H04N 5/228* (2006.01)
*H03M 1/12* (2006.01)

(52) U.S. Cl.
USPC ...................................... 348/222.1; 341/155

(58) Field of Classification Search
USPC ........ 348/222.1, 241, 300, 301, 302; 341/155
See application file for complete search history.

(56) References Cited

U.S. PATENT DOCUMENTS

| 7,126,511 | B2* | 10/2006 | Draxelmayr et al. | 341/136 |
|---|---|---|---|---|
| 7,504,973 | B2* | 3/2009 | Inagaki | 341/139 |
| 7,525,462 | B2* | 4/2009 | Parthasarthy et al. | 341/139 |
| 7,710,306 | B2* | 5/2010 | Mori | 341/169 |
| 8,284,092 | B2* | 10/2012 | Koyama et al. | 341/166 |
| 2004/0177102 | A1* | 9/2004 | Nakamura et al. | 708/200 |
| 2007/0268172 | A1* | 11/2007 | Watanabe | 341/155 |
| 2008/0143860 | A1* | 6/2008 | Sato | 348/301 |

FOREIGN PATENT DOCUMENTS

| JP | 55-040443 A | 3/1980 |
|---|---|---|
| JP | 63-316108 A | 12/1988 |
| JP | 5-259907 A | 10/1993 |
| JP | 2002-373392 A | 12/2002 |
| JP | 2004-274157 A | 9/2004 |
| JP | 2005-322327 A | 11/2005 |

OTHER PUBLICATIONS

International Search Report of PCT/JP2010/061646, mailing date Aug. 17, 2010.

(Continued)

*Primary Examiner* — Nhan T Tran
*Assistant Examiner* — Xi Wang
(74) *Attorney, Agent, or Firm* — Westerman, Hattori, Daniels & Adrian, LLP

(57) ABSTRACT

Disclosed is a time AD converter which is provided with an annular delay circuit, a digital signal generation unit, and an annular delay circuit control unit. The annular delay circuit has n delay units (where n is a natural number equal to or larger than 2). The digital signal generation unit generates a digital signal corresponding to an analog signal by using an output of the annular delay circuit. The annular delay circuit control unit controls a current which is input to the n delay units in accordance with an external environmental signal.

7 Claims, 21 Drawing Sheets

(56) References Cited

OTHER PUBLICATIONS

Watanabe, Takamoto et al., "An All-Digital Analog-to-Digital Converter With 12-μ V/LSB Using Moving—Average Filtering", IEEE Journal of Solid- State Circuits, Jan. 2003, pp. 120-125, vol. 38, No. 1.

Watanabe, Takamoto et al., "An All-Digital Analog-to-Digital Converter With 12-μ V/LSB Using Moving—Average Filtering", IEEE Journal of Solid-State Circuits, Jan. 2003, pp. 120-125, vol. 38. Office Action dated Apr. 23, 2013, issued in corresponding Japanese Application No. 2009-168013, with English translation (6 pages).

* cited by examiner

TIME AD CONVERTER AND SOLID STATE IMAGE PICKUP DEVICE

CROSS REFERENCE TO RELATED APPLICATIONS

This application is a continuation application based on a PCT Patent Application No. PCT/JP2010/061646, filed Jul. 8, 2010, whose priority is claimed on Japanese Patent Application No. 2009-168013 filed Jul. 16, 2009, the entire content of which are hereby incorporated by reference.

BACKGROUND OF THE INVENTION

1. Field of the Invention

The present invention relates to a time AD converter and a solid-state image pickup device.

2. Description of the Related Art

As examples of time AD converters, those disclosed in Japanese Unexamined Patent Application, First Publication, No. H5-259907 and Japanese Unexamined Patent Application, First Publication, No. 2004-274157 have been known. FIG. 21 is a diagram illustrating a configuration of a time AD converter. A time AD converter 3 includes an annular delay circuit 10, a counter 12, an encoder 14, a latch circuit 16, a latch circuit 18, a latch circuit 20, and an arithmetic unit 22. In the annular delay circuit 10, one NAND circuit NAND that is an inversion circuit for activation operating as a delay unit based on a pulse signal StartP received at one input terminal thereof, and a plurality of inverter circuits INV are connected in a ring shape. The counter 12 and the encoder 14 measure an output signal from the annular delay circuit 10. The latch circuit 16 holds an output signal from the counter 12. The latch circuit 18 holds an output signal from the encoder 14. The latch circuit 20 adds an output signal from the latch circuit 16 to an output signal from the latch circuit 18, and holds an added signal. The arithmetic unit 22 calculates a difference between a previous signal and a present signal using the latch circuit 20, and outputs the difference to an external post-stage circuit.

Power is supplied to the NAND circuit NAND and the inverters INV of the annular delay circuit 10 via a power line 11a. Furthermore, an input terminal 2a of an analog signal $V_{in}$ to be subject to AD-conversion is connected to the power line 11a.

Next, the operation of the AD converter 3 will be described. The annular delay circuit 10 allows the pulse signal StartP to circulate in a ring-shaped circuit in which one NAND circuit NAND and the plurality of inverters INV are connected to each other.

The counter 12 counts the number of circulations of the pulse signal StartP in the annular delay circuit 10, and outputs a count result as binary digital data. Here, the characteristics of the annular delay circuit 10 are changed according to periods of the analog signal $V_{in}$ and a clock (CLK) signal CKs. Thus, a propagation delay time of the pulse signal StartP is changed according to the periods of the analog signal $V_{in}$ and the clock (CLK) signal CKs.

The encoder 14 detects a position of the pulse signal StartP circulating in the annular delay circuit 10, and outputs a detection result as binary digital data.

The latch circuit 16 latches digital data which is output from the counter 12. The latch circuit 18 latches digital data which is output from the encoder 14. The latch circuit 20 takes digital data from the latch circuit 16 as an upper bit and digital data from the latch circuit 18 as a lower bit, and adds these digital data, thereby generating binary digital data corresponding to the analog signal $V_{in}$ in the period of the clock (CLK) signal CKs.

The arithmetic unit 22 calculates a difference between digital data after being held in the latch circuit 20 and digital data before being held in the latch circuit 20, and outputs the difference to the external post-stage circuit.

FIG. 22A and FIG. 22B are diagrams illustrating an analog signal $V_{in}$, a propagation delay time, and a sampling period. FIG. 22A is a diagram illustrating a change in the propagation delay time according to the analog signal $V_{in}$ in the annular delay circuit 10. A vertical axis indicates the analog signal $V_{in}$ and the propagation delay time. A horizontal axis indicates time. FIG. 22B illustrates that the above-mentioned AD converter 3 periodically outputs digital data DT1, DT2, DT3, ..., based on the clock (CLK) signal CKs.

Japanese Unexamined Patent Application, First Publication, No. 2004-274157 discloses that the relationship between an analog signal $V_{in}$ (a signal voltage) and a count value is corrected (hereinafter referred to as "environment correction") using the above-mentioned AD converter according to an external environment (temperature in Japanese Unexamined Patent Application, First Publication, No. 2004-274157).

However, the time AD converter performs the above-mentioned environment correction outside the time AD converter. Therefore, the circuit size of a solid-state image pickup device using the time AD converter may be increased.

SUMMARY

The present invention provides a time AD converter that performs environment correction with a simple circuit configuration and a solid-state image pickup device using the time AD converter.

A time AD converter may include: an annular delay circuit that includes n delay units (where n is a natural number equal to or larger than 2); a digital signal generation unit configured to generate a digital signal corresponding to an analog signal by using an output of the annular delay circuit; and an annular delay circuit control unit configured to control a current, which is input to the n delay units, based on an external environmental signal.

The external environmental signal may be a count value output from the digital signal generation unit.

The annular delay circuit control unit may include: i current sources (where i is a natural number equal to or larger than 2) corresponding to the analog signal; and a current control unit configured to perform control such that outputs of j current sources (where j is a natural number 1 to i) of the i current sources are input to the n delay units based on the external environmental signal.

The annular delay circuit control unit may include: a variable resistor connected in series to the n delay units between an analog signal input terminal and a reference potential terminal; and a current control unit configured to control a resistance value of the variable resistor based on the external environmental signal.

The annular delay circuit control unit may include: a variable resistor connected in series to a corresponding delay unit in a one-to-one manner between an analog signal input terminal and a reference potential terminal; and a current control unit configured to control a resistance value of the variable resistor based on the external environmental signal.

The annular delay circuit control unit may include: a current control unit configured to input a predetermined voltage to the annular delay circuit, generate the external environmental signal from an output of the annular delay circuit, and control a current flowing through the delay units based on the external environmental signal.

A solid-state image pickup device may include: an image capturing unit in which a plurality of pixels each of which outputs a pixel signal according to an amount of incident electromagnetic waves are arranged in a matrix form; and a time AD converter according to claim 1, which performs AD-conversion on an analog signal corresponding to the pixel signal.

According to the present invention, a time AD converter can perform environment correction with respect to the relationship between an analog signal and a digital signal using a simple circuit configuration according to changes in external environment (a temperature, a power supply voltage, a process and the like). In the same manner, a solid-state image pickup device using the time AD converter can perform environment correction with a simple circuit configuration.

DETAILED DESCRIPTION OF THE PREFERRED EMBODIMENTS

Hereinafter, the present invention will be described with reference to detailed preferred embodiments. Those skilled in the art can make various different preferred embodiments based on the disclosure of the present invention, and the present invention is not limited to preferred embodiments illustrated for description.

First Preferred Embodiment

Figure 1:
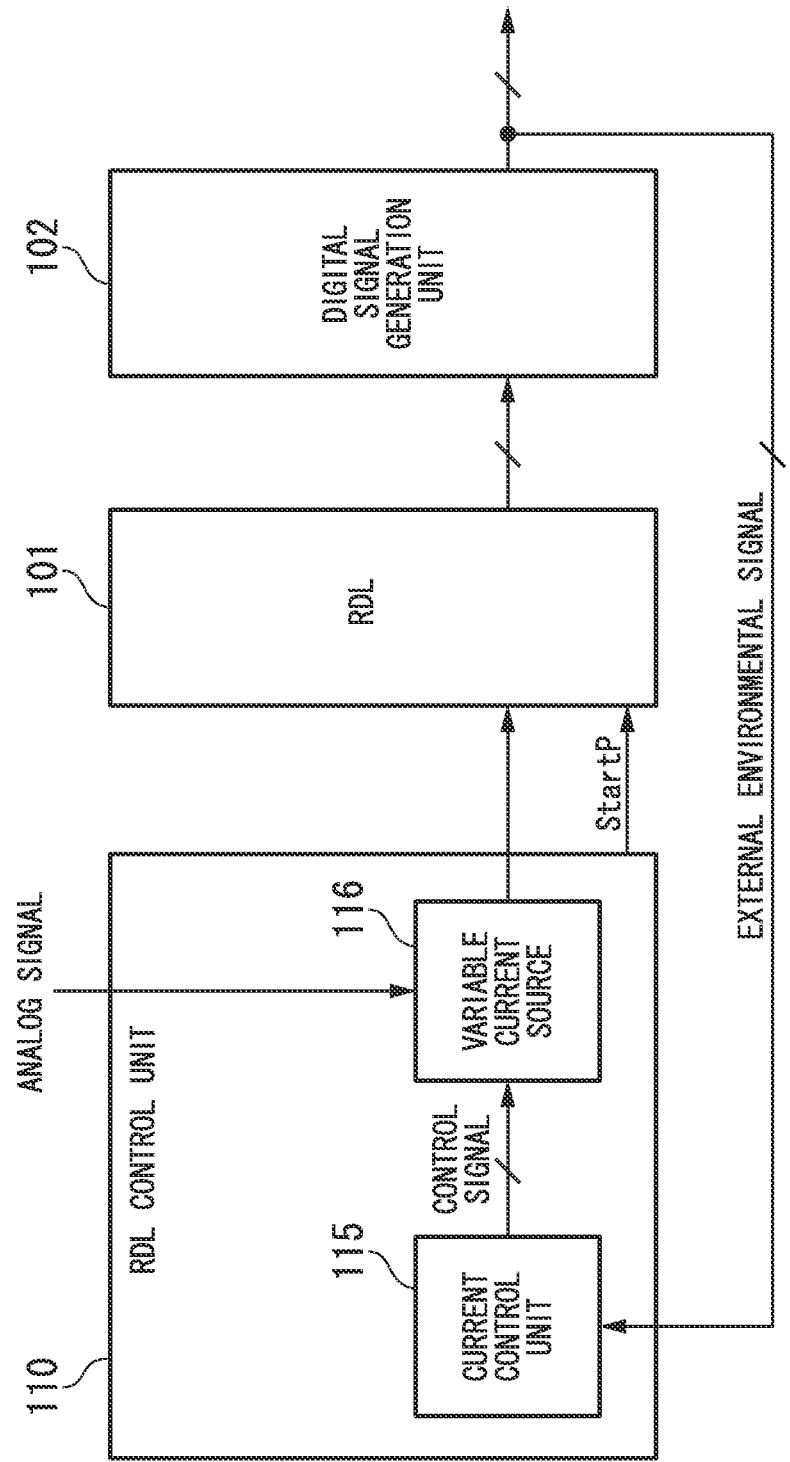
FIG. 1 is a diagram illustrating a configuration example of a time AD converter in accordance with a first preferred embodiment of the present invention.

Hereinafter, preferred embodiments of the present invention will be described with reference to the accompanying drawings. FIG. 1 is a diagram illustrating a configuration example of a time AD converter in accordance with the first preferred embodiment of the present invention. The time AD converter includes a ring delay line (RDL) 101 which is an annular delay circuit provided with n delay units (where n is a natural number equal to or larger than 2), a digital signal generation unit 102 that generates a digital signal from an output of the RDL 101, and an RDL control unit 110.

The RDL control unit 110 includes a current control unit 115 that uses the digital signal generated by the digital signal generation unit 102 as an external environmental signal, and a variable current source 116. Hereinafter, the external environmental signal is a count value changing according to a change in external environment (temperature, power supply voltage, a process and the like). The variable current source 116 includes i current sources 120 (FIG. 2 to FIG. 5) (where i is a natural number equal to or larger than 2) that supply a current corresponding to an analog signal to be subject to AD-conversion. Furthermore, the variable current source 116 controls the number of the current sources 120 (FIG. 2 to FIG. 5), which supply the current to the RDL 101, based on a control signal from the current control unit 115, thereby supplying the RDL 101 with the current corresponding to the number of current sources 120.

Figure 2:
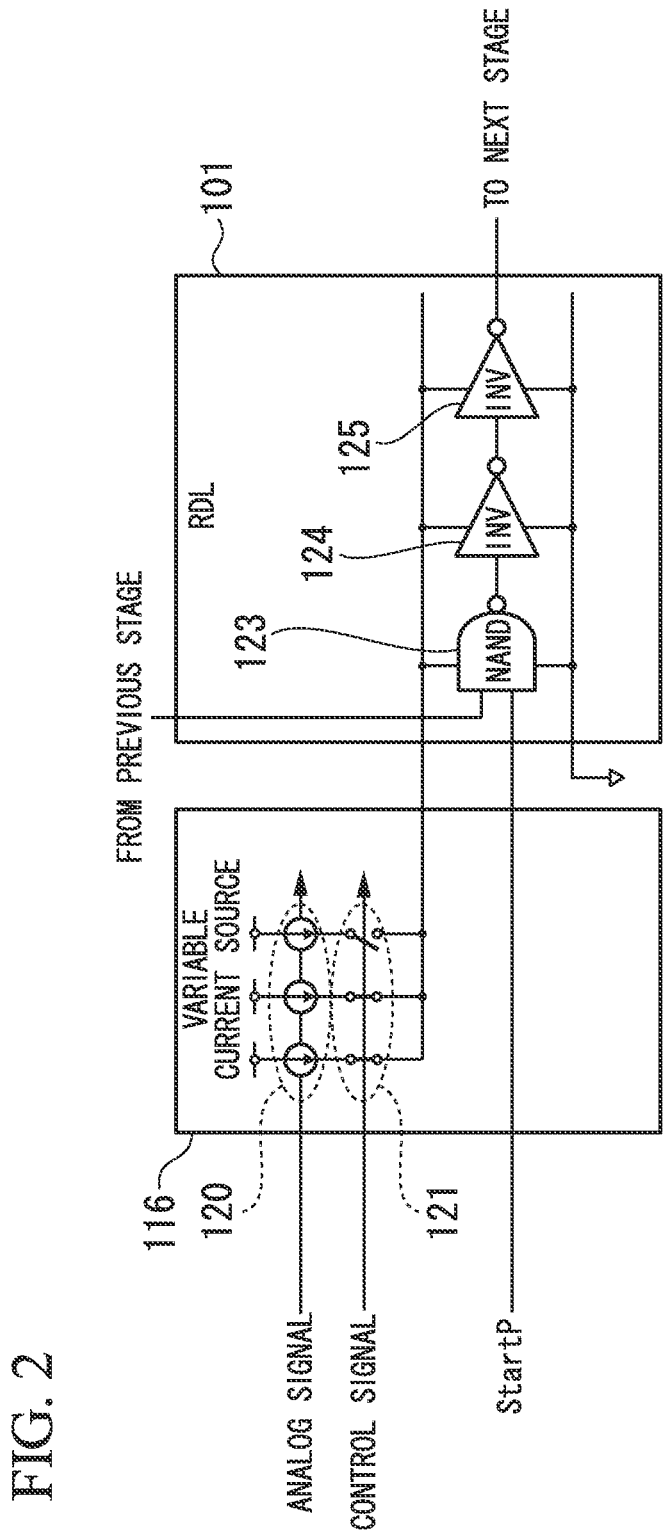
FIG. 2 is a diagram illustrating a first example of (a partial enlargement of) a RDL 101 and a detailed configuration of a variable current source 116 of FIG. 1.

FIG. 2 is a diagram illustrating a first example of (a partial enlargement of) the RDL 101 and a detailed configuration of the variable current source 116 of FIG. 1. In FIG. 2, the RDL 101 includes inversion circuits (a NAND circuit and an INV circuit) which are delay units. Furthermore, the variable current source 116 includes three current sources 120 that supply a current corresponding to an analog signal.

Next, the operation of the first preferred embodiment will be described. For the purpose of convenience, it is assumed that an analog signal to be subject to AD-conversion is 1 to 2 V, and a proportional relationship is established between the value of the current, which is supplied from the variable current source 116 to the RDL 101, and the digital signal and the external environmental signal which are output from the digital signal generation unit 102. Furthermore, the three current sources 120 provided in the variable current source 116 are configured to allow the current values of the current sources to be approximately equal to one another.

In addition, when a current corresponding to one current source is supplied from the variable current source 116 to the RDL 101 in a reference state (temperature: Typical, voltage: Typical, and a process: Typical), it is assumed that the digital signal and the external environmental signal output from the digital signal generation unit 102 are 500 to 1000 counts according to 1 to 2 V.

Thus, in the reference state, when a current corresponding to two current sources is supplied from the variable current source 116 to the RDL 101, the digital signal and the external environmental signal output from the digital signal generation unit 102 are 1000 to 2000 counts. Furthermore, in the reference state, when a current corresponding to three current sources is supplied from the variable current source 116 to the RDL 101, the digital signal and the external environmental signal output from the digital signal generation unit 102 are 1500 to 3000 counts.

Here, in the reference state, a state in which the current corresponding to two current sources is supplied from the variable current source 116 to the RDL 101 is defined as a state A (environment A). Hereinafter, the state A (environment A), a state B (environment B), and a state C (environment C) are different from one another.

Furthermore, a threshold value level C at which it is determined that the state A (environment A) has been changed to the state C (environment C) is defined as 667 counts. Furthermore, a threshold value level B at which it is determined that the state A (environment A) has been changed to the state B (environment B) is defined as 4000 counts. In addition, the values of the threshold value levels are for illustrative purposes only.

Here, the state A (environment A) is changed to the state B (environment B), so that the digital signal and the external environmental signal output from the digital signal generation unit 102 reach 4000 counts or more, which indicates the threshold value level B. In this case, the current control unit 115 outputs a control signal to the variable current source 116 based on the external environmental signal, and is thereby effective while controlling only one switch 121 of the variable current source 116. Thus, since the current corresponding to one current source is supplied from the variable current source 116 to the RDL 101, the current flowing through the RDL 101 is ½ when the current state is the state A, and the digital signal output from the digital signal generation unit 102 is also ½ when the current state is the state A.

Next, the state A (environment A) is changed to the state C (environment C), so that the digital signal and the external environmental signal output from the digital signal generation unit 102 reach 667 counts or less, which indicates the threshold value level C. In this case, the current control unit 115 outputs a control signal to the variable current source 116 based on the external environmental signal, and is thereby effective while controlling only three switches 121 of the variable current source 116. Thus, since the current corresponding to three current sources is supplied from the variable current source 116 to the RDL 101, the current flowing through the RDL 101 is 1.5 times larger than the case when the current state is the state A, and the digital signal output from the digital signal generation unit 102 is also 1.5 times larger than the case when the current state is the state A.

Preferably, the external environmental signal to be used in environment correction includes a plurality of external environmental signals (which can preferably be statistically processed) and is determined based on the plurality of external environmental signals.

In this way, the current control unit 115 can suppress (correct) a digital signal, which has been considerably increased/decreased by a change in external environment, to become approximately equal to the state A (environment A). This operation and control are for illustrative purposes only, and the present invention is not limited thereto.

Figure 3:
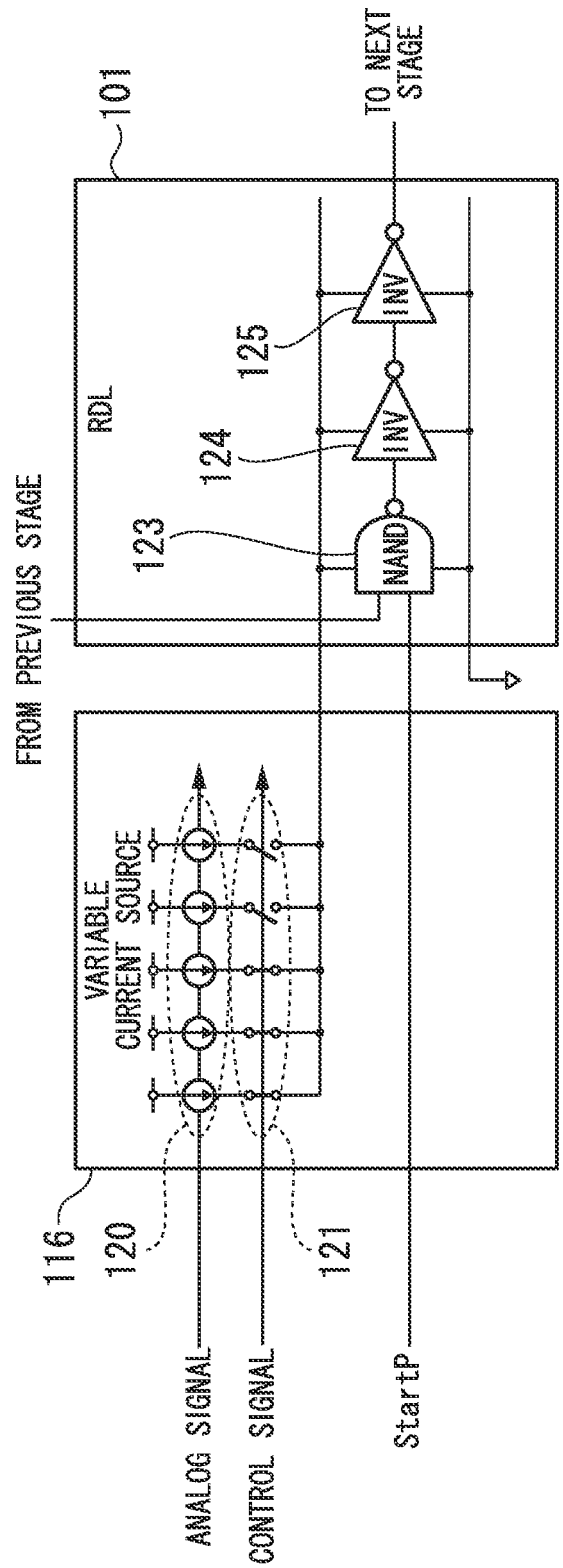
FIG. 3 is a diagram illustrating a second example of (a partial enlargement of) the RDL 101 and a detailed configuration of the variable current source 116 of FIG. 1.

FIG. 3 is a diagram illustrating a second example of (a partial enlargement of) the RDL 101 and a detailed configuration of the variable current source 116 of FIG. 1. That is, FIG. 3 is a diagram illustrating the RDL 101 provided with inversion circuits (a NAND circuit 123 and INV circuits 124 and 125) which are delay units, and the variable current source 116 provided with five current sources 120 that supply a current corresponding to an analog signal. In addition, the RDL 101 includes a plurality of INV circuits (not illustrated) provided at the next stage, and an output of the INV circuit provided at the final stage (from the "previous stage" of FIG. 3) is input to the NAND circuit 123.

Next, the operation of the first preferred embodiment will be described. For the purpose of convenience, it is assumed that an analog signal to be subject to AD-conversion is 1 to 2 V, and a proportional relationship is established between the value of the current flowing through the RDL 101, and the digital signal and the external environmental signal which are output from the digital signal generation unit 102.

Furthermore, it is assumed that current values of the five current sources 120 constituting the variable current source 116 are approximately equal to one another. In addition, when a current corresponding to one current source is supplied from the variable current source 116 to the RDL 101 in a reference state (temperature: Typical, voltage: Typical, and a process: Typical), it is assumed that the digital signal and the external environmental signal output from the digital signal generation unit 102 are 500 to 1000 counts.

Thus, when a current corresponding to two current sources is supplied from the variable current source 116 to the RDL 101, the digital signal and the external environmental signal output from the digital signal generation unit 102 are 1000 to 2000 counts. Furthermore, when a current corresponding to three current sources is supplied from the variable current source 116 to the RDL 101, the digital signal and the external environmental signal output from the digital signal generation unit 102 are 1500 to 3000 counts. In addition, when a current corresponding to four current sources is supplied from the variable current source 116 to the RDL 101, the digital signal and the external environmental signal output from the digital signal generation unit 102 are 2000 to 4000 counts. Moreover, when a current corresponding to five current sources is supplied from the variable current source 116 to the RDL 101, the digital signal and the external environmental signal output from the digital signal generation unit 102 are 2500 to 5000 counts.

In the reference state, a state in which the current corresponding to three current sources is supplied from the variable current source 116 to the RDL 101 is defined as a state A (environment A). Furthermore, a threshold value level E at which it is determined that the state A (environment A) has been changed to a state E (environment E) is defined as 900 counts. Furthermore, a threshold value level D at which it is determined that the state A (environment A) has been changed to the state D (environment D) is defined as 1125 counts. Furthermore, a threshold value level B at which it is determined that the state A (environment A) has been changed to the state B (environment B) is defined as 4500 counts. Furthermore, a threshold value level C at which it is determined that the state A (environment A) has been changed to the state C (environment C) is defined as 9000 counts. In addition, the values of these threshold value levels are for illustrative purposes only. Furthermore, the values of these threshold value levels, for example, may be stored in a memory (not illustrated) in an adjustment process of the time AD converter, and the current control unit 115 may appropriately refer to the values.

Here, the state A (environment A) is changed to the state B (environment B), so that the digital signal and the external environmental signal from the digital signal generation unit 102 reach 4500 counts or more (9000 counts or less), which is the threshold value level B. In this case, the current control unit 115 outputs a control signal to the variable current source 116 based on the external environmental signal, and is thereby effective while controlling only two switches 121 of the variable current source 116. Thus, since the current corresponding to two current sources is supplied from the variable current source 116 to the RDL 101, the current flowing through the RDL 101 is reduced, and the digital signal output from the digital signal generation unit 102 is also reduced.

Next, the state A (environment A) is changed to the state C (environment C), so that the digital signal and the external environmental signal from the digital signal generation unit 102 reach 9000 counts or more, which is the threshold value level C. In this case, the current control unit 115 outputs a control signal to the variable current source 116 based on the external environmental signal, and is thereby effective while controlling only one switch 121 of the variable current source 116. Thus, since the current corresponding to one current source is supplied from the variable current source 116 to the RDL 101, the current flowing through the RDL 101 is further reduced, and the digital signal output from the digital signal generation unit 102 is further reduced.

Next, the state A (environment A) is changed to the state D (environment D), so that the digital signal and the external environmental signal output from the digital signal generation unit 102 reach (900 counts or more) 1125 counts or less, which is the threshold value level D. In this case, the current control unit 115 outputs a control signal to the variable current source 116 based on the external environmental signal, and is thereby effective while controlling only four switches 121 of the variable current source 116. Thus, since the current corresponding to four current sources is supplied from the variable current source 116 to the RDL 101, the current flowing through the RDL 101 is increased, and the digital signal output from the digital signal generation unit 102 is also increased.

Next, the state A (environment A) is changed to the state E (environment E), so that the digital signal and the external environmental signal output from the digital signal generation unit 102 reach 900 counts or less, which is the threshold value level F. In this case, the current control unit 115 outputs a control signal to the variable current source 116 based on the external environmental signal, and is thereby effective while controlling only five switches 121 of the variable current source 116. Thus, since the current corresponding to five current sources is supplied from the variable current source 116 to the RDL 101, the current flowing through the RDL 101 is further increased, and the digital signal output from the digital signal generation unit 102 is further increased. Preferably, the external environmental signal to be used in environment correction includes a plurality of external environmental signals (which can preferably be statistically processed) and is determined based on the plurality of external environmental signals.

In this way, it is possible to suppress a digital signal considerably increased/decreased by a change in external environment to approximately reach the state A (environment A). This operation and control are for illustrative purposes only, and the present invention is not limited thereto. In the second example, the case in which the i (three and five) current sources constitute the variable current source 116 has been described. However, the present invention is not limited to this configuration. Furthermore, the current sources constituting the variable current source 116 may have different configurations.

Figure 4:
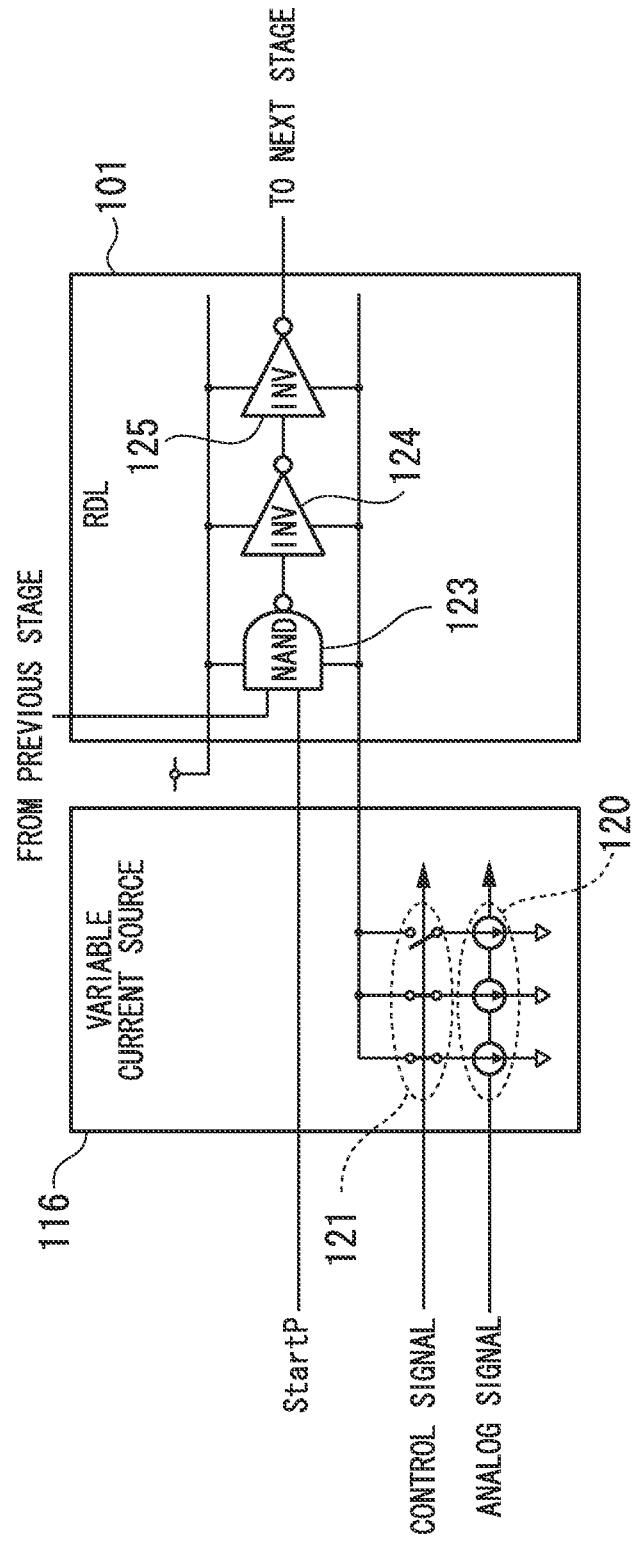
FIG. 4 is a diagram illustrating a third example of (a partial enlargement of) the RDL 101 and a detailed configuration of the variable current source 116 of FIG. 1.

FIG. 4 is a diagram illustrating a third example of (a partial enlargement of) the RDL 101 and a detailed configuration of the variable current source 116 of FIG. 1. In FIG. 4, a connection relationship between the RDL 101 and the variable current source 116 is different from that of FIG. 2. That is, the connection relationship between the RDL 101 and the variable current source 116 is substantially equal to that in FIG. 2, except that the current source 120 and the switch 121 are connected to a lower power source of the delay unit (the NAND circuit 123 and the plurality of INV circuits).

Figure 5:
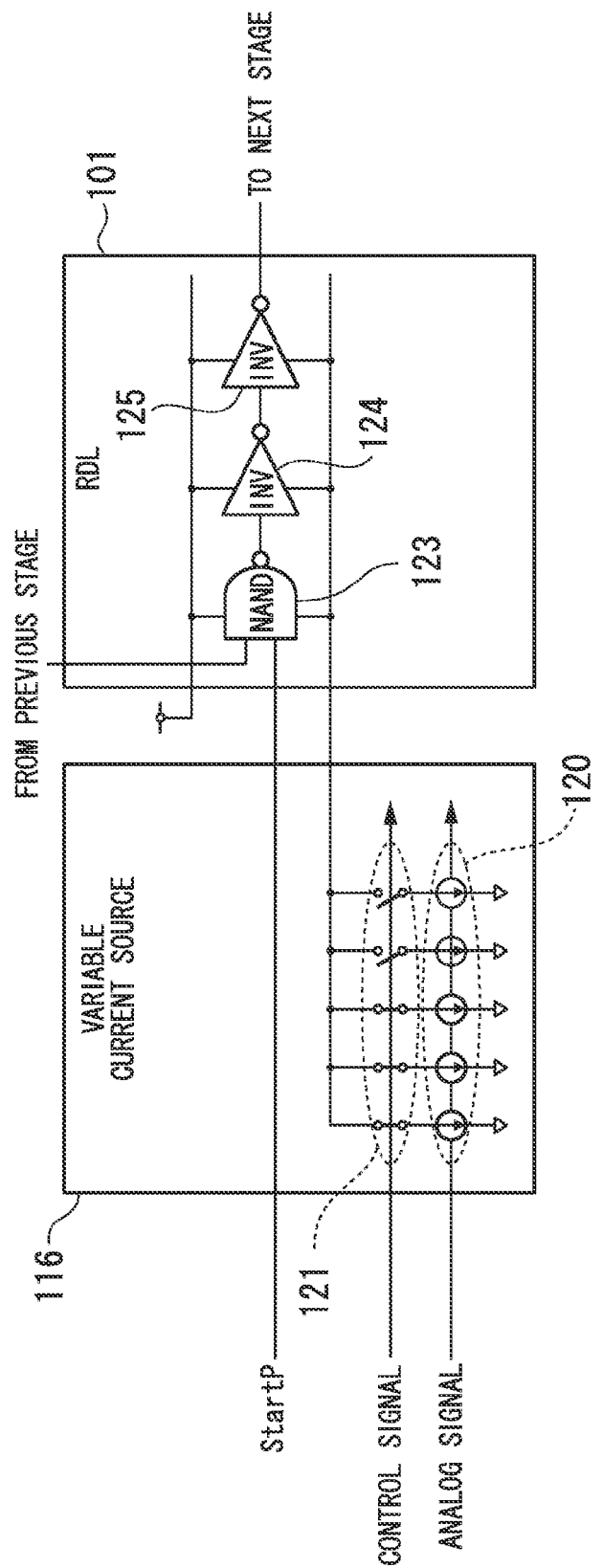
FIG. 5 is a diagram illustrating a fourth example of (a partial enlargement of) the RDL 101 and a detailed configuration of the variable current source 116 of FIG. 1.

FIG. 5 is a diagram illustrating a fourth example of (a partial enlargement of) the RDL 101 and a detailed configuration of the variable current source 116 of FIG. 1. In FIG. 5, a connection relationship between the RDL 101 and the variable current source 116 is different from that of FIG. 3. That is, the connection relationship between the RDL 101 and the variable current source 116 is substantially equal to that in FIG. 3, except that the current source 120 and the switch 121 are connected to a lower power source of the delay unit (the NAND circuit 123 and the plurality of INV circuits).

As described above, in the configuration of the present proposal, a current flowing through the RDL which is an annular delay circuit is controlled in a digital manner, so that the time AD converter can perform environment correction with a simple circuit configuration.

Second Preferred Embodiment

Figure 6:
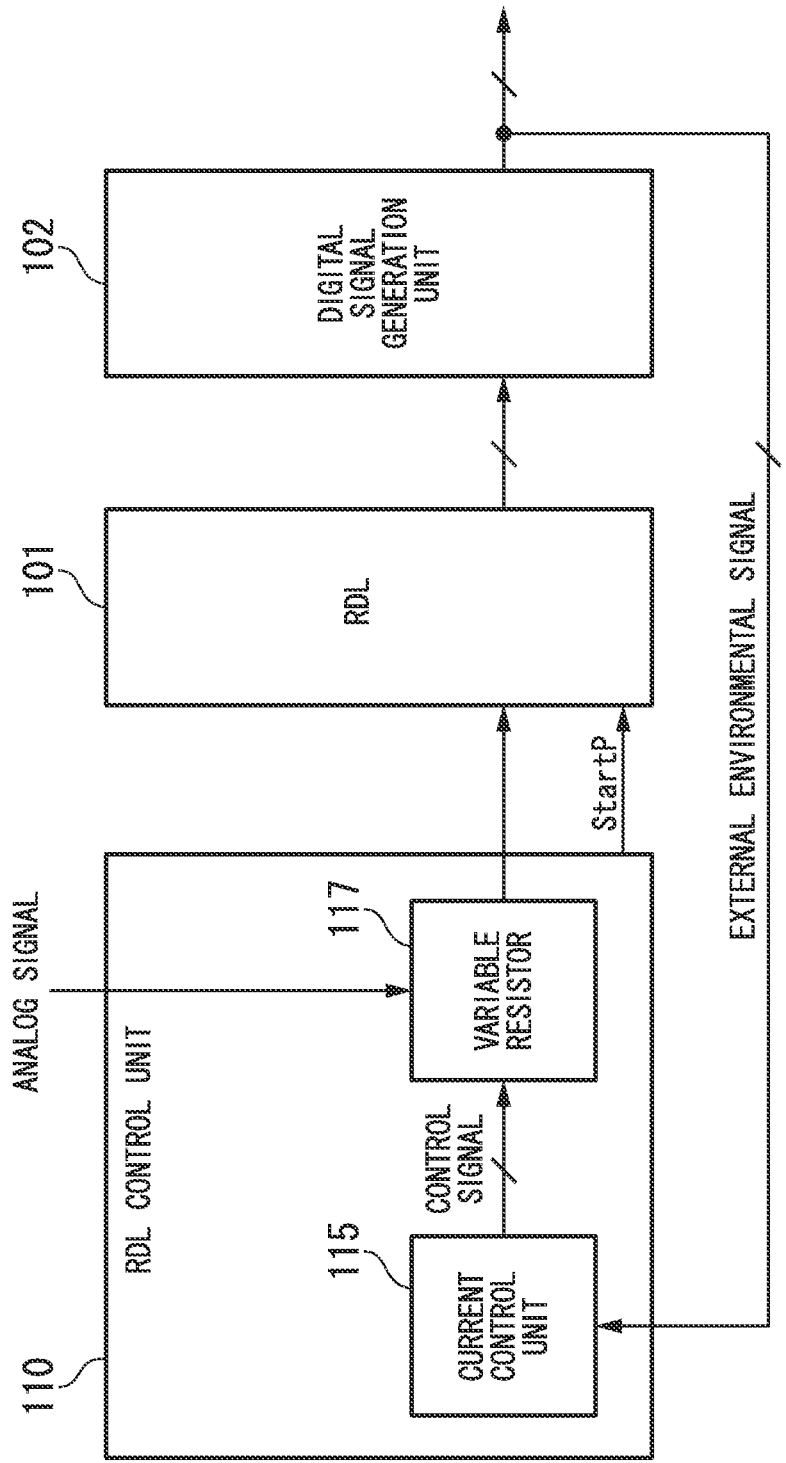
FIG. 6 is a diagram illustrating a configuration example of a time AD converter in accordance with a second preferred embodiment of the present invention.

FIG. 6 is a diagram illustrating a configuration example of a time AD converter in accordance with the second preferred embodiment of the present invention. The time AD converter includes an RDL 101 which is an annular delay circuit provided with n delay units (where n is a natural number equal to or larger than 2), a digital signal generation unit 102 that generates a digital signal from the output of the RDL 101 and an RDL control unit 110.

The RDL control unit 110 includes a current control unit 115 and a variable resistor 117. The current control unit 115 uses the digital signal, which is generated by the digital signal generation unit 102, as an external environmental signal. The variable resistor 117 has an analog signal input terminal for inputting an analog signal to be subject to AD-conversion to the RDL 101, and a resistor connected in series to the n delay units between the analog signal input terminal and a reference potential terminal. Furthermore, the resistance value of the resistor is controlled based on a control signal from the current control unit 115.

Figure 7:
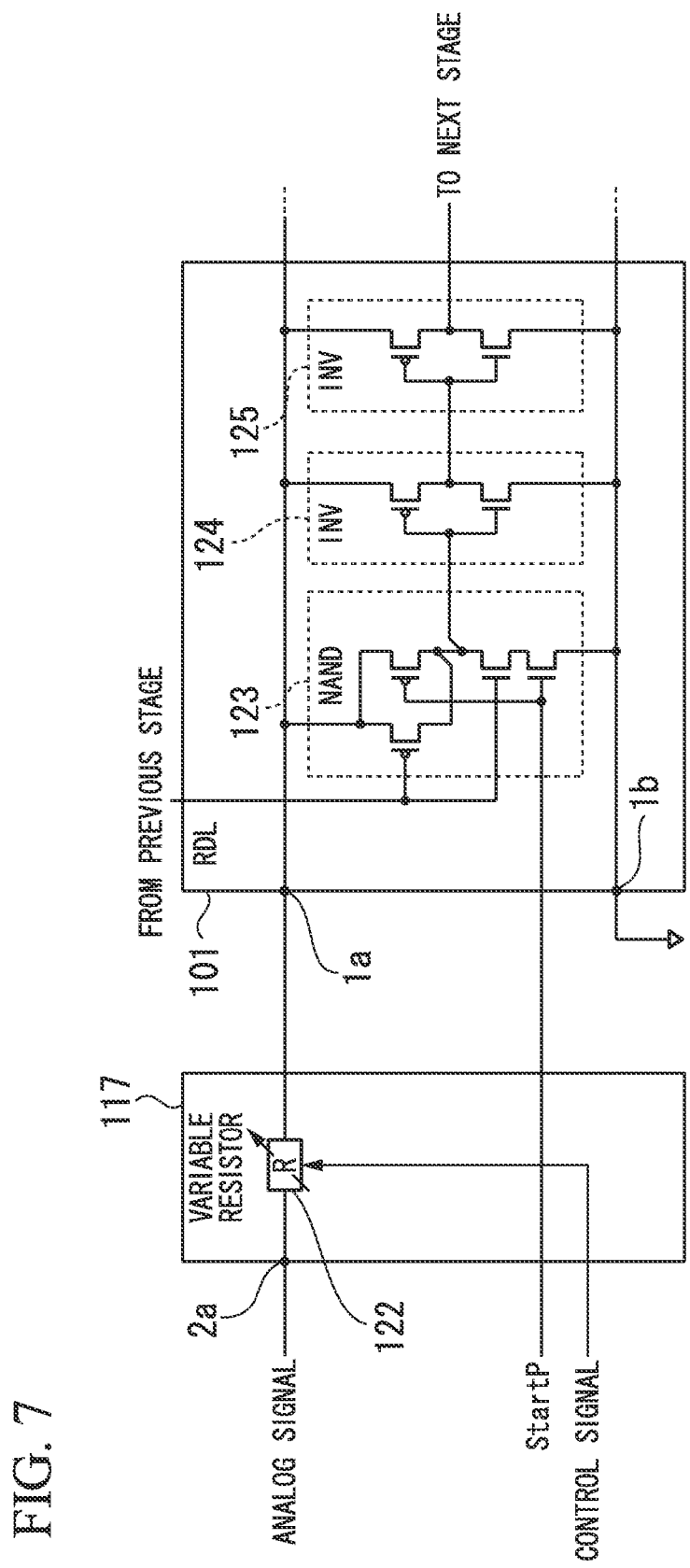
FIG. 7 is a diagram illustrating a first example of (a partial enlargement of) the RDL 101 and a detailed configuration of the variable resistor 117 of FIG. 6.

FIG. 7 is a diagram illustrating a first example of (a partial enlargement of) the RDL 101 and a detailed configuration of the variable resistor 117 of FIG. 6. The variable resistor 117 is provided between an analog signal input terminal 2a and a reference potential terminal (a lower power terminal 1b in FIG. 7).

Next, the operation of the second preferred embodiment will be described. For the purpose of convenience, it is assumed that an analog signal to be subject to AD-conversion is 1 to 2 V, and a proportional relationship is established between a resistance value for controlling a current flowing through the RDL 101, and the digital signal and the external environmental signal from the digital signal generation unit 102.

Furthermore, it is assumed that the resistance value of the variable resistor 117 is changed in three steps of (resistance value: large), (resistance value: intermediate), and (resistance value: small). In addition, in a reference state (temperature: Typical, voltage: Typical, and a process: Typical), when the resistance value of the variable resistor 117 is the (resistance value: large), it is assumed that the digital signal and the external environmental signal output from the digital signal generation unit 102 are 500 to 1000 counts.

Thus, when the resistance value of the variable resistor 117 is the (resistance value: intermediate), it is assumed that the digital signal and the external environmental signal output from the digital signal generation unit 102 are 1000 to 2000 counts. Furthermore, when the resistance value of the variable resistor 117 is the (resistance value: small), it is assumed that the digital signal and the external environmental signal output from the digital signal generation unit 102 are 1500 to 3000 counts.

In the reference state, a state in which the resistance value of the variable resistor 117 is (resistance value: intermediate) is defined as a state A (environment A). Furthermore, a threshold value level C at which it is determined that the state A (environment A) has been changed to a state C (environment C) is defined as 667 counts. Furthermore, a threshold value level B at which it is determined that the state A (environment A) has been changed to the state B (environment B) is defined as 4000 counts. In addition, the values of the threshold value levels are for illustrative purposes only.

Here, the state A (environment A) is changed to the state B (environment B), so that the digital signal and the external environmental signal output from the digital signal generation unit 102 reach 4000 counts or more, which is the threshold value level B. In this case, the current control unit 115 outputs a control signal to the variable resistor 117 based on the external environmental signal, thereby controlling the resistance value of the variable resistor 117 to be large. Thus, the current flowing through the RDL 101 is reduced, and the digital signal output from the digital signal generation unit 102 is also reduced.

Next, the state A (environment A) is changed to the state C (environment C), so that the digital signal and the external environmental signal output from the digital signal generation unit 102 reach 667 counts or less, which is the threshold value level C. In this case, the current control unit 115 outputs a control signal to the variable resistor 117 based on the external environmental signal, thereby controlling the resistance value of the variable resistor 117 to be small. Thus, the current flowing through the RDL 101 is increased, and the digital signal output from the digital signal generation unit 102 is also increased.

Preferably, the external environmental signal to be used in environment correction includes a plurality of external environmental signals (which can preferably be statistically processed) and is determined based on the plurality of external environmental signals.

In this way, the current control unit 115 can suppress a digital signal considerably increased/decreased by a change in external environment to approximately reach the state A (environment A). This operation and control are for illustrative purposes only, and the present invention is not limited thereto. In the second preferred embodiment, the resistance value of the variable resistor 117 has three steps, that is "resistance value: large", "resistance value: intermediate", and "resistance value: small". However, the present invention is not limited thereto.

Figure 8:
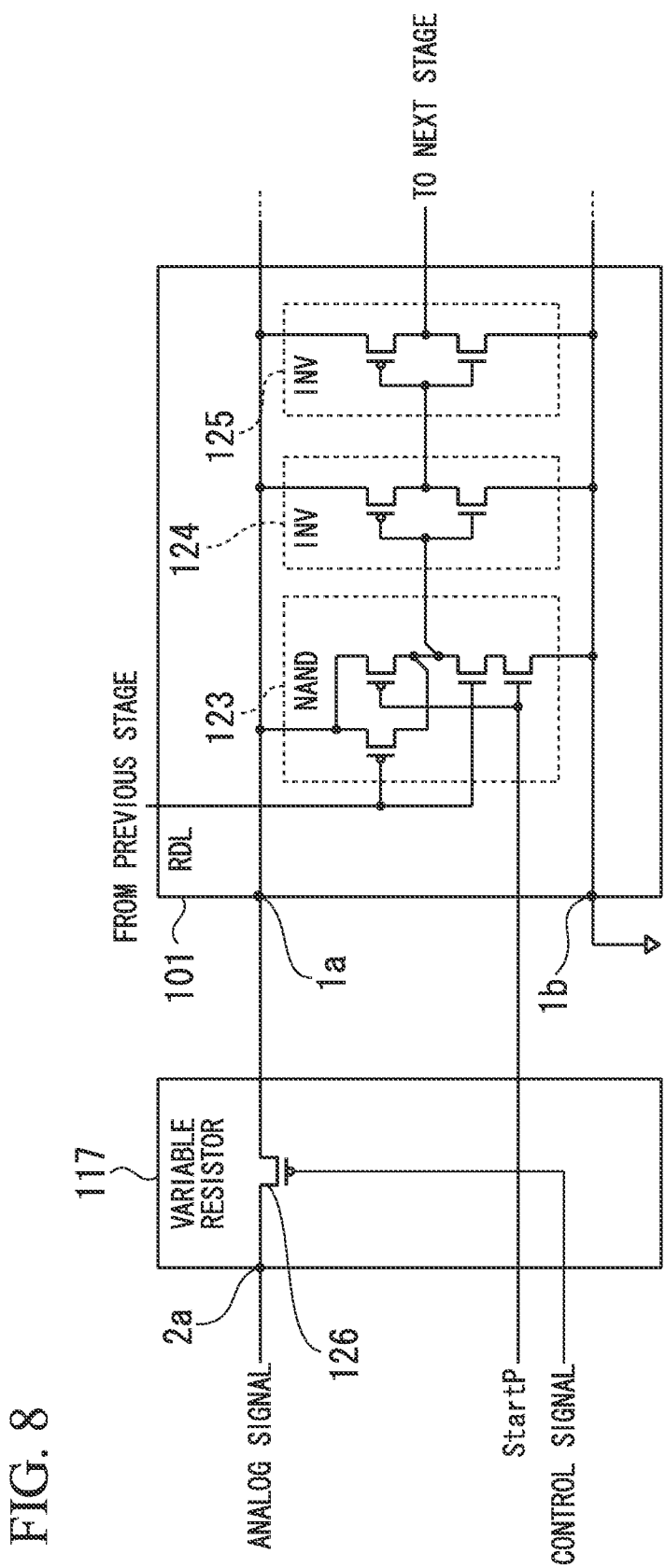
FIG. 8 is a diagram illustrating a second example of (a partial enlargement of) the RDL 101 and a detailed configuration of the variable resistor 117 of FIG. 6.

FIG. 8 is a diagram illustrating a second example of (a partial enlargement of) the RDL 101 and a detailed configuration of the variable current source 116 of FIG. 6. FIG. 8 is substantially equal to FIG. 7, except that a PMOS transistor is used in the variable resistor 117. However, an NMOS transistor may also be used in the variable resistor 117, or other transistors may also be used in the variable resistor 117.

Figure 9:
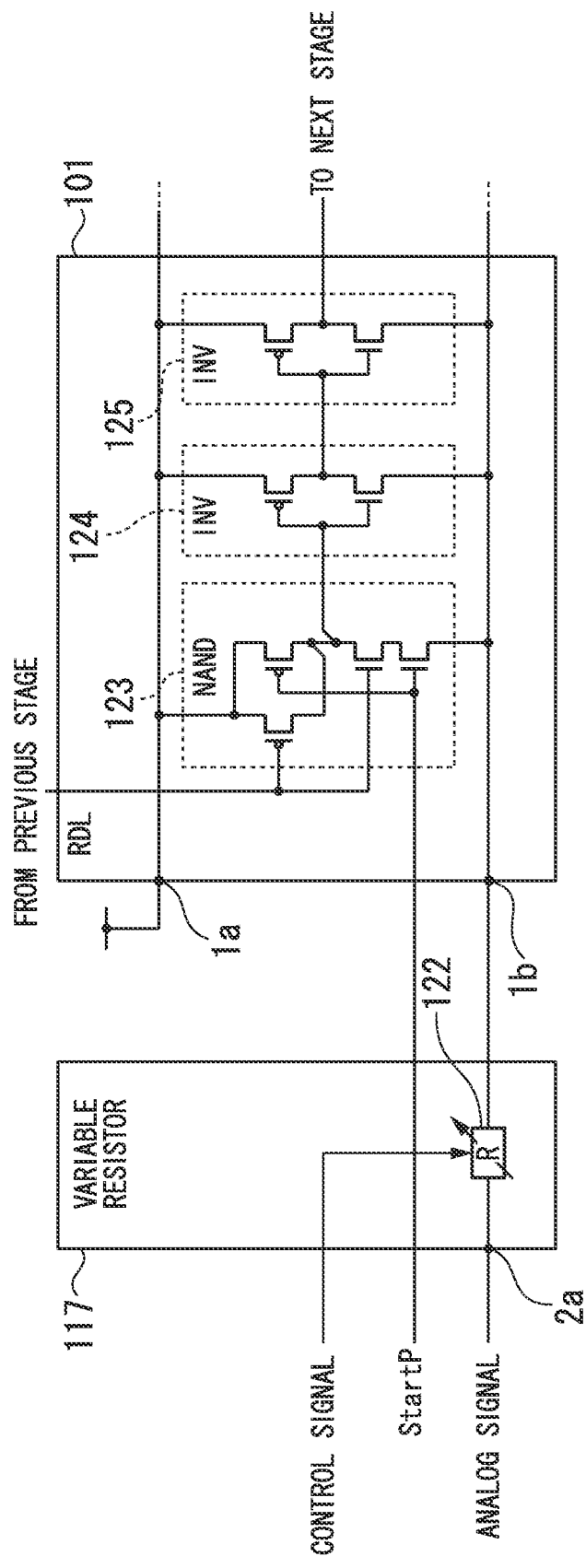
FIG. 9 is a diagram illustrating a third example of (a partial enlargement of) the RDL 101 and a detailed configuration of the variable resistor 117 of FIG. 6.
Figure 10:
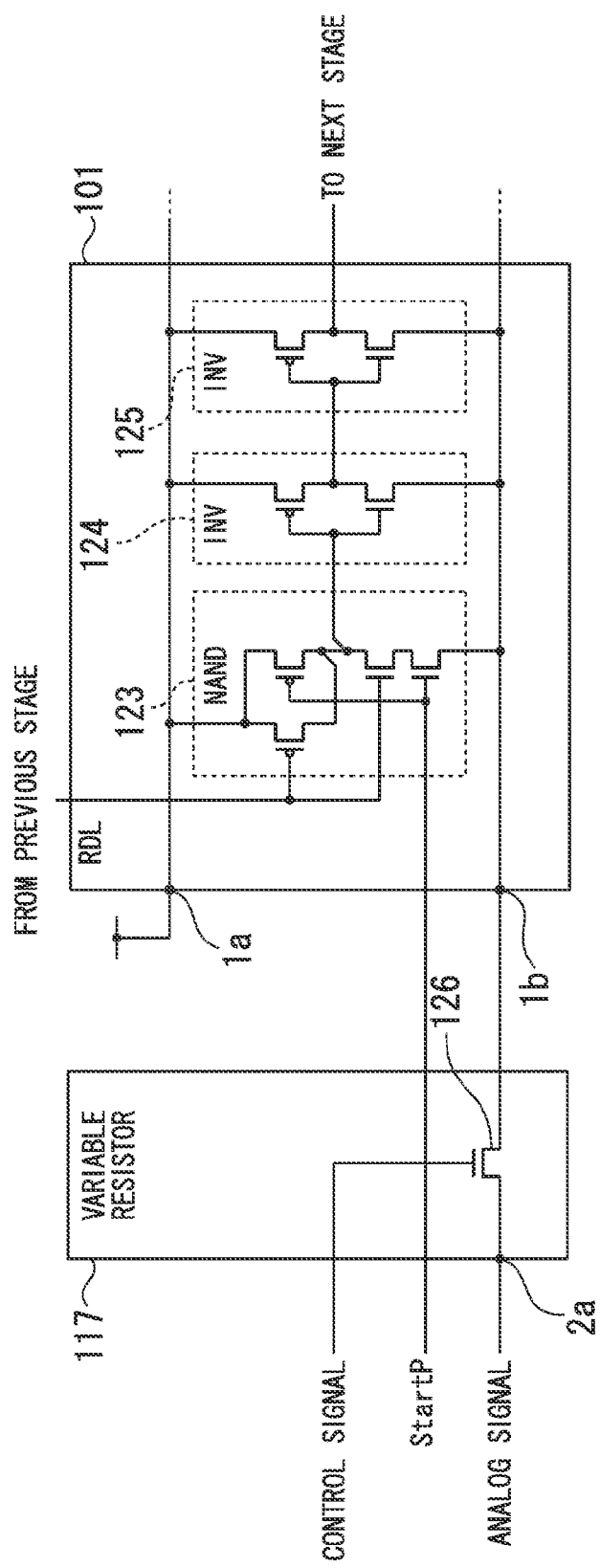
FIG. 10 is a diagram illustrating a fourth example of (a partial enlargement of) the RDL 101 and a detailed configuration of the variable resistor 117 of FIG. 6.

FIG. 9 is a diagram illustrating a third example of (a partial enlargement of) the RDL 101 and a detailed configuration of the variable resistor 117 of FIG. 6. FIG. 9 is substantially equal to FIG. 7, except that a variable resistor 122 is connected between an input terminal 2a of an analog signal $V_{in}$ and a lower power terminal 1b. Furthermore, FIG. 10 is a diagram illustrating a fourth example of (a partial enlargement of) the RDL 101 and a detailed configuration of the variable resistor 117 of FIG. 6. FIG. 10 is substantially equal to FIG. 7, except that a transistor 126 is connected between an input terminal 2a of an analog signal $V_{in}$ and a lower power terminal 1b.

As described above, in the configuration of the present proposal, it is possible to reduce the number of control elements used to control a current flowing through the RDL which is an annular delay circuit, as compared with the first preferred embodiment.

Third Preferred Embodiment

Figure 11:
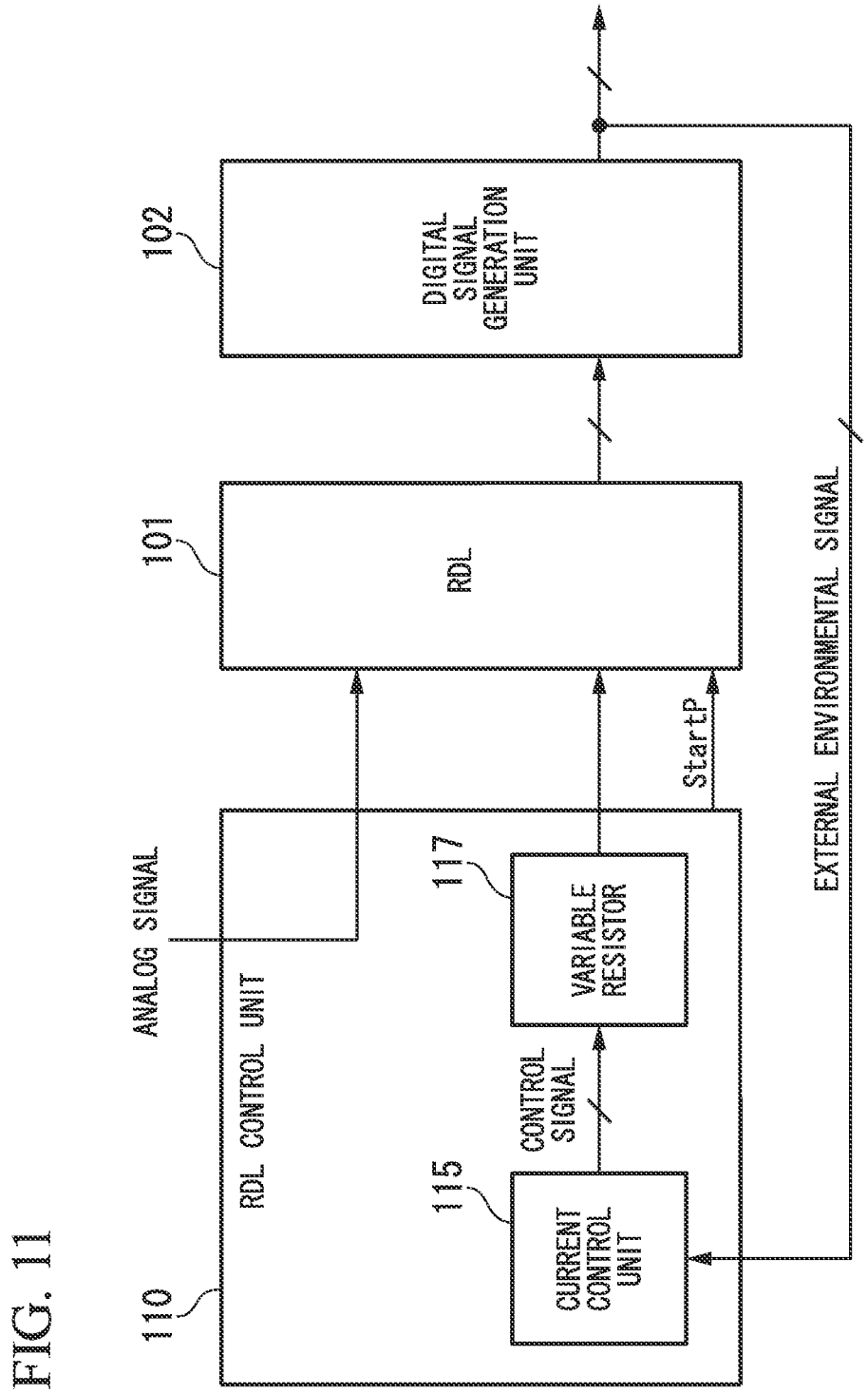
FIG. 11 is a diagram illustrating a configuration example of a time AD converter in accordance with a third preferred embodiment of the present invention.

FIG. 11 is a diagram illustrating a configuration example of a time AD converter in accordance with the third preferred embodiment of the present invention. The time AD converter includes an RDL 101 which is an annular delay circuit provided with n delay units (where n is a natural number equal to or larger than 2), a digital signal generation unit 102 that generates a digital signal from the output of the RDL 101, and an RDL control unit 110.

The RDL control unit 110 includes a current control unit 115 and a variable resistor 117. The current control unit 115 uses the digital signal, which is generated by the digital signal generation unit 102, as an external environmental signal. The variable resistor 117 has an analog signal input terminal for inputting an analog signal to be subject to AD-conversion to the RDL 101, and a variable resistor connected to a corresponding delay unit in a one-to-one manner between the analog signal input terminal and a reference potential terminal. Furthermore, a resistance value of the variable resistor is controlled based on a control signal from the current control unit 115.

Figure 12:
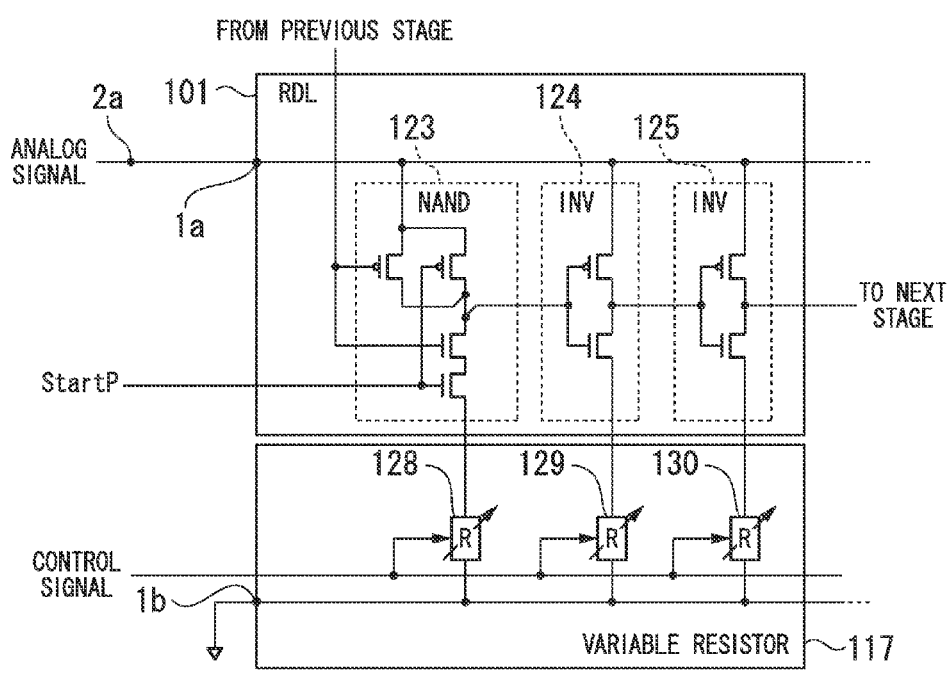
FIG. 12 is a diagram illustrating a first example of (a partial enlargement of) the RDL 101 and a detailed configuration of the variable resistor 117 of FIG. 11.

FIG. 12 is a diagram illustrating a first example of (a partial enlargement of) the RDL 101 and a detailed configuration of the variable resistor 117 of FIG. 11. The variable resistor 117 is provided between an analog signal input terminal 2a and a reference potential terminal (a lower power terminal 1b in FIG. 12). The operation of the third preferred embodiment is substantially the same as that of the second preferred embodiment.

Figure 13:
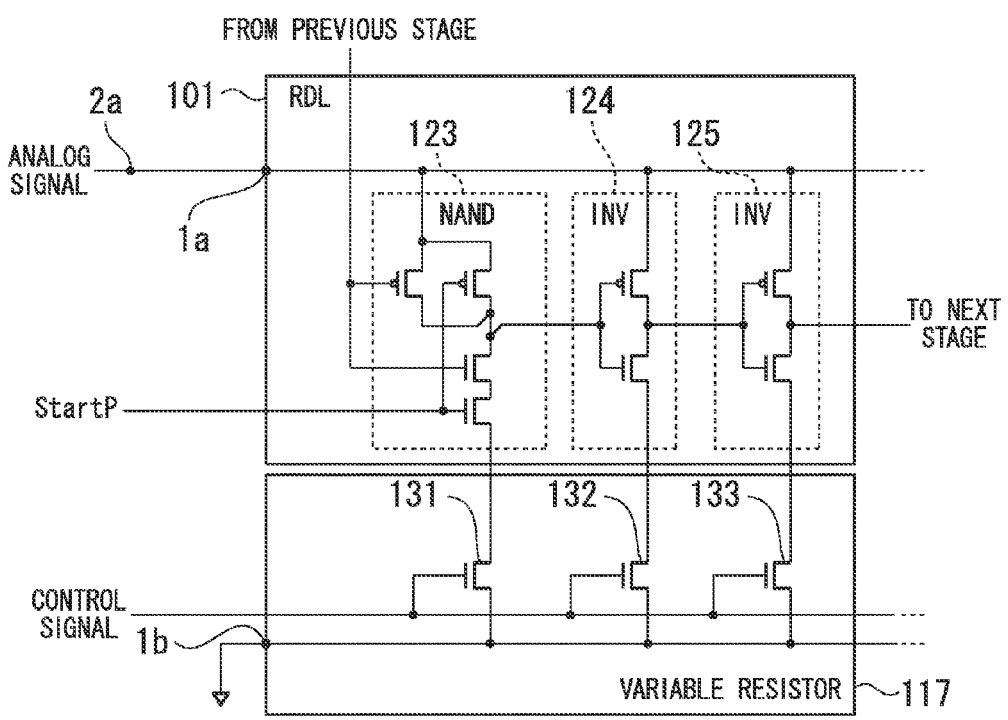
FIG. 13 is a diagram illustrating a second example of (a partial enlargement of) the RDL 101 and a detailed configuration of the variable resistor 117 of FIG. 11.

FIG. 13 is a diagram illustrating a second example of (a partial enlargement of) the RDL 101 and a detailed configuration of the variable resistor 117 of FIG. 11. FIG. 13 is substantially equal to FIG. 12, except that an NMOS transistor is used in the variable resistor 117. However, a PMOS transistor may also be used in the variable resistor 117, or other transistors may also be used in the variable resistor 117.

Figure 14:
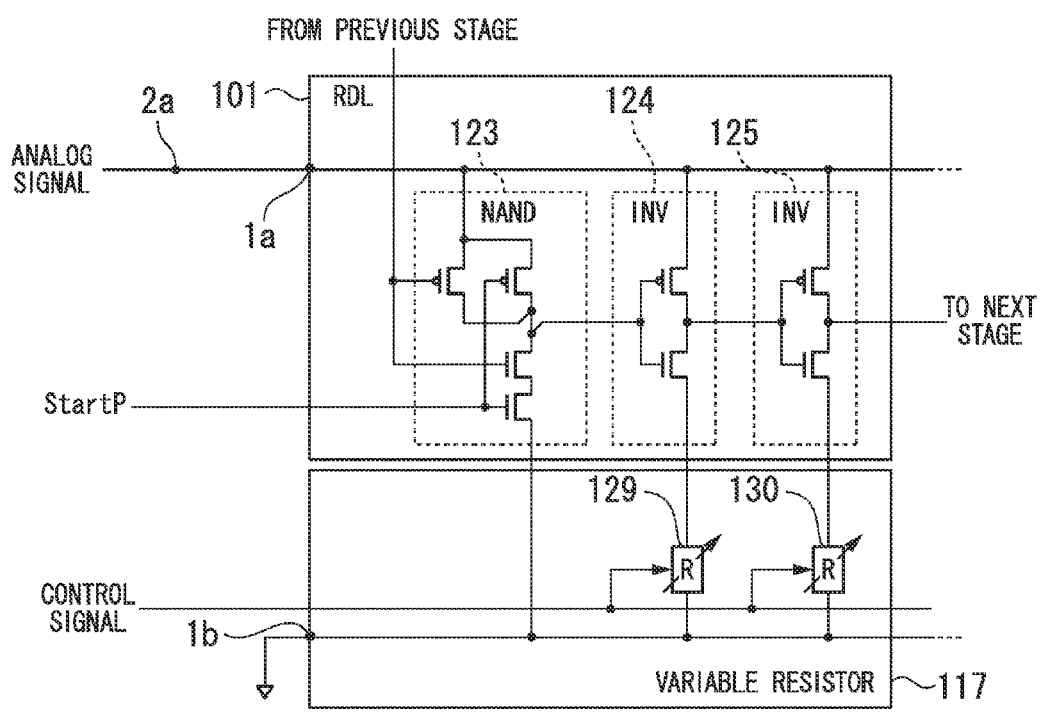
FIG. 14 is a diagram illustrating a third example of (a partial enlargement of) the RDL 101 and a detailed configuration of the variable resistor 117 of FIG. 11.

FIG. 14 is a diagram illustrating a third example of (a partial enlargement of) the RDL 101 and a detailed configuration of the variable resistor 117 of FIG. 11. The variable resistor 117 is provided between an analog signal input terminal 2a and a reference potential terminal (a lower power terminal 1b in FIG. 14). However, the variable resistor 117 is connected only to a corresponding INV circuit of delay units constituting the RDL 101. For example, a variable resistor 129 is connected to an INV circuit 124 and a variable resistor 130 is connected to an INV circuit 125. The operation of the third preferred embodiment is substantially the same as that of the second preferred embodiment.

Figure 15:
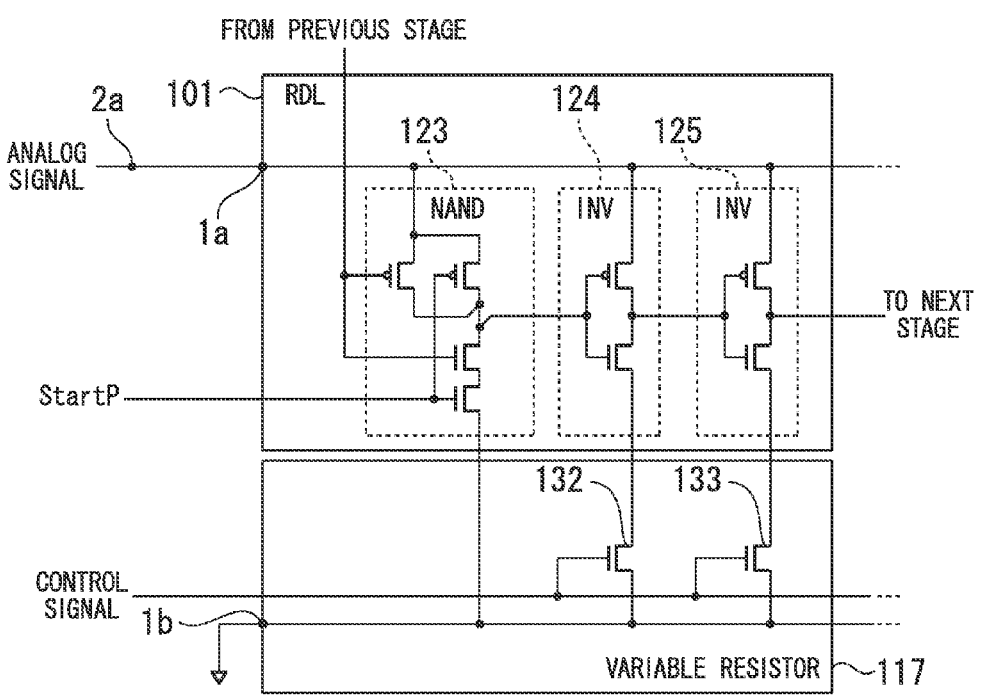
FIG. 15 is a diagram illustrating a fourth example of (a partial enlargement of) the RDL 101 and a detailed configuration of the variable resistor 117 of FIG. 11.

FIG. 15 is a diagram illustrating a fourth example of (a partial enlargement of) the RDL 101 and a detailed configuration of the variable resistor 117 of FIG. 11. FIG. 15 is substantially equal to FIG. 12, except that an NMOS transistor is used in the variable resistor 117. However, a PMOS transistor may also be used in the variable resistor 117, or other transistors may also be used in the variable resistor 117.

As described above, in the configuration of the present proposal, it is possible to perform current control in each delay unit constituting the RDL which is an annular delay circuit.

Fourth Preferred Embodiment

Figure 16:
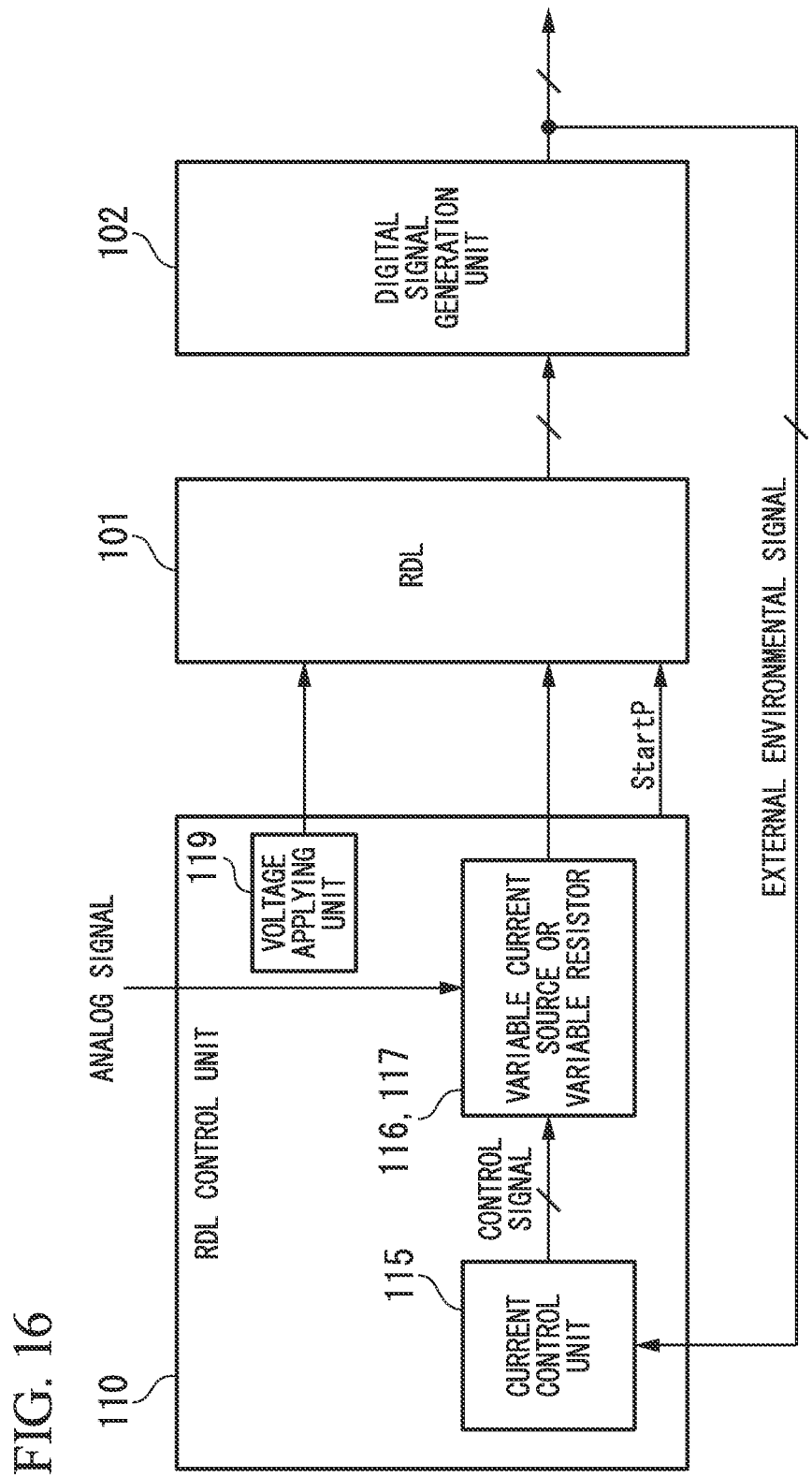
FIG. 16 is a diagram illustrating a configuration example of a time AD converter in accordance with a fourth preferred embodiment of the present invention.

FIG. 16 is a diagram illustrating a configuration example of a time AD converter in accordance with the fourth preferred embodiment of the present invention. The fourth preferred embodiment is substantially equal to the first to third preferred embodiments, except that a voltage applying unit 119 is provided in an RDL control unit 110.

The voltage applying unit 119 outputs a test voltage, which is a predetermined voltage, to an RDL 101. The use of the predetermined voltage enables a current control unit 115 to achieve a high accurate external environmental signal reflecting external environment.

Next, the environment correction operation of the fourth preferred embodiment will be described. First, in a reference state (reference environment), the voltage applying unit 119 inputs the test voltage to the RDL 101. In this case, a digital signal output from a digital signal generation unit 102 will be referred to as a reference digital signal. Furthermore, an external environmental signal based on the reference digital signal will be referred to as a reference-external signal below. In addition, since the external environmental signal is a signal branched from the reference digital signal, the external environmental signal is approximately equal to the reference digital signal.

Hereinafter, for the purpose of convenience, an external environment state is classified into three states, that is, a state A (environment A), a state B (environment B), and a state C (environment C). In the state A (environment A), it is assumed that a digital signal A is approximately equal to the reference digital signal and the external environmental signal is also approximately equal to a reference-external environmental signal. Furthermore, in the state B (environment B), it is assumed that a digital signal B is larger than the reference digital signal and the external environmental signal is also larger than the reference-external environmental signal. Furthermore, in the state C (environment C), it is assumed that a digital signal C is smaller than the reference digital signal and the external environmental signal is also smaller than the reference-external environmental signal.

Initially, the current control unit 115 acquires the external environmental signal in the state (environment) before environment correction. The current control unit 115 acquires the external environmental signal in the state in which the test voltage is output from the voltage applying unit 119 to the RDL 101.

Next, the current control unit 115 compares the acquired external environmental signal with the reference-external environmental signal, and determines whether the state before the environment correction is any one of states A, B and C. In addition, the current control unit 115 outputs a control signal based on a determination result and controls a variable current source 116 or a variable resistor 117.

For example, when it is determined that the state before the environment correction is the state A (environment A), current control is maintained. That is, the current control unit 115 does not newly control the variable current source 116 or the variable resistor 117.

For example, when it is determined that the state before the environment correction is the state B (environment B), the current control unit 115 controls the variable current source 116 or the variable resistor 117 by a control signal such that a current flowing through the RDL 101 is reduced. Thus, since the current flowing through the RDL 101 is reduced and the digital signal output from the digital signal generation unit 102 is also reduced, the digital signal is approximately equal to the reference digital signal.

For example, when it is determined that the state before the environment correction is the state C (environment C), the current control unit 115 controls the variable current source 116 or the variable resistor 117 by a control signal such that a current flowing through the RDL 101 is increased. Thus, since the current flowing through the RDL 101 is increased and the digital signal output from the digital signal generation unit 102 is also increased, the digital signal is approximately equal to the reference digital signal. The environmental correction operation and the control are for illustrative purposes only, and the present invention is not limited thereto.

As described above, in the configuration in accordance with the fourth preferred embodiment, it is possible to acquire the external environmental signal corresponding to the test voltage. Thereby, environment correction can be performed with high accuracy.

Fifth Preferred Embodiment

Figure 17:
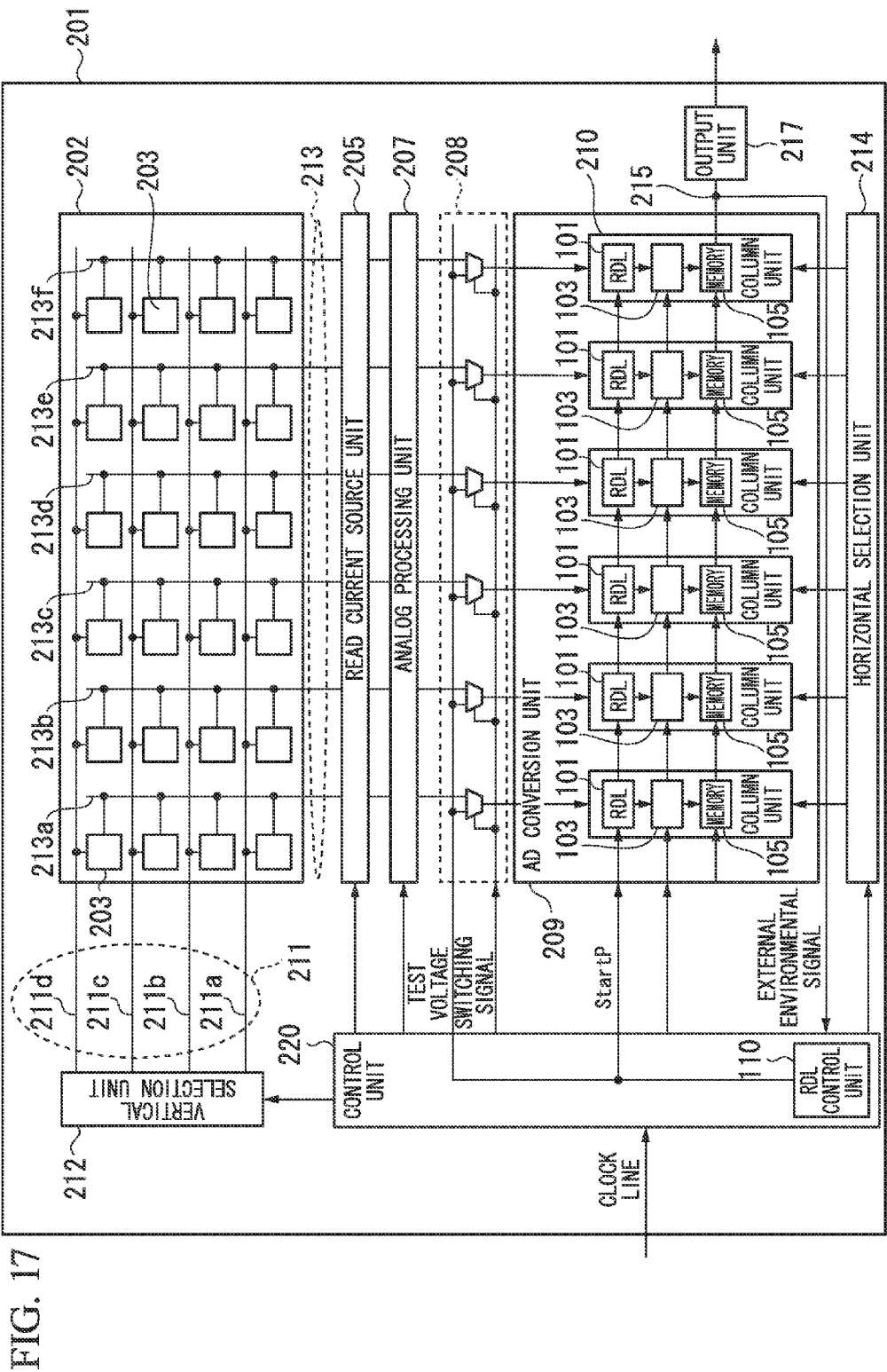
FIG. 17 is a schematic configuration diagram of a (C) MOS solid-state image pickup device in accordance with a fifth preferred embodiment of the present invention.

FIG. 17 is a schematic configuration diagram of a (C) MOS solid-state image pickup device in accordance with the fifth preferred embodiment of the present invention. A solid-state image pickup device 201 includes an image capturing unit 202, a vertical selection unit 212, a read current source 205, an analog processing unit 207, an AD conversion unit 209, a horizontal selection unit 214, an output unit 217, and a control unit 220.

The image capturing unit 202 includes a plurality of unit pixels 203 arranged in a matrix form. Each unit pixel 203 generates and outputs a signal corresponding to the amount of incident electromagnetic waves. The vertical selection unit 212 selects each row of the image capturing unit 202. The read current source 205 reads a signal (a pixel signal), which is output from each unit pixel 203 of the image capturing unit 202, as a voltage signal.

The analog processing unit 207 performs a CDS (Correlated Double Sampling) process and other processes (a clamp process) with respect to the signal (the pixel signal) output from each unit pixel 203, and outputs a processed signal.

The AD conversion unit 209 includes a plurality of column units (circuits) 210 corresponding to columns of the unit pixels 203. Each column unit 210 acquires the signal processed by the analog processing unit 207, and performs AD-conversion on the acquired signal based on the acquired signal.

The horizontal selection unit 214 selects and reads data (pixel information) stored in each column unit 210, and outputs the selected data to the output unit 217 via a horizontal signal line 215. The output unit 217 acquires a signal read from each column unit 210.

The control unit 220 includes an RDL control unit 110 and controls the above-mentioned elements.

In FIG. 17, the case in which the image capturing unit 202 includes 4 rows×6 columns of unit pixels 203 for simplification has been described. However, in reality, several tens to several thousands of unit pixels 203 are arranged in rows and columns of the image capturing unit 202. The unit pixel 203 constituting the image capturing unit 202 includes a photoelectric conversion element such as a photodiode (not illustrated), a photogate (not illustrated), or a phototransistor (not illustrated), and a transistor circuit.

The unit pixels 203 are connected to the vertical selection unit 212 via vertical control lines 211a to 211d. The vertical control lines 211a to 211d are control lines for selecting rows of the unit pixels 203 arranged in a matrix form. Furthermore, signals (pixel signals) output by the selected unit pixels 203 are output to the read current source 205 and the analog processing unit 207 via vertical signal lines 213a to 213f.

Figure 18:
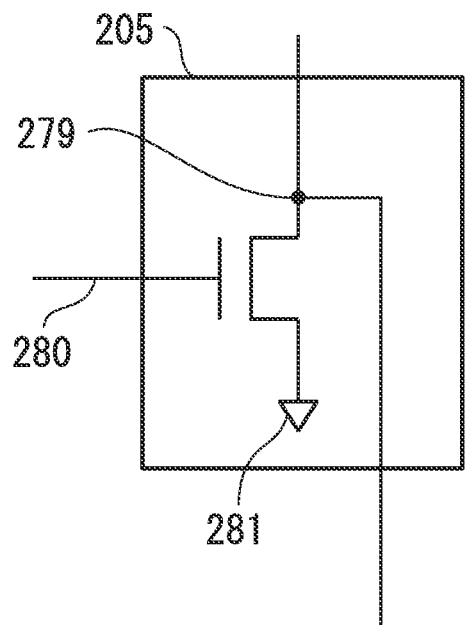
FIG. 18 is a diagram illustrating a configuration example of a read current source 205.

FIG. 18 is a diagram illustrating a configuration example of the read current source 205. In FIG. 18, the read current source 205 uses an NMOS transistor as a current source. Furthermore, each unit pixel 203 is connected to a drain terminal of the NMOS transistor via the vertical signal line 213. Furthermore, a desired voltage is applied to a control terminal of the NMOS transistor. Furthermore, a ground potential (GND) is connected to a source terminal of the NMOS transistor. In this way, a signal from each pixel circuit 203 is output in a voltage mode. In FIG. 18, the case in which the NMOS transistor is used as the current source has been described. However, the present invention is not limited thereto.

Figure 19:
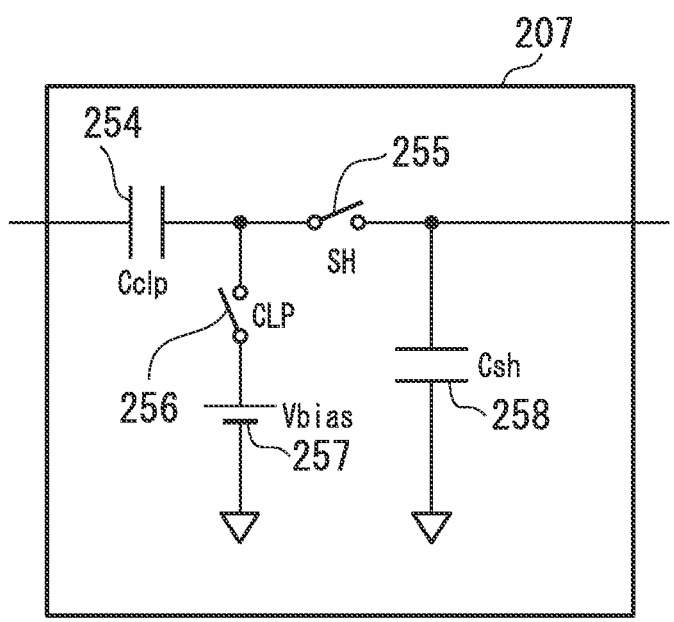
FIG. 19 is a diagram illustrating a configuration example of an analog processing unit 207.

FIG. 19 is a diagram illustrating a configuration example of the analog processing unit 207. The analog processing unit 207 performs a CDS (Correlated Double Sampling) process to remove noise from the signals (the pixel signals) output by the selected unit pixels 203.

The analog processing unit 207 includes a clamp capacitor (Cclp) 254 connected to the vertical signal line 213, a clamp switch (SW_clp) 256 for clamping the clamp capacitor (Cclp) 254 to a clamp bias (Vbias) 257, and a sample hold capacitor 258 (Csh) and a sample hold switch 255 (SW_sh) for sample-holding the signals output by the selected unit pixels 203.

The analog processing unit 207 performs a CDS process in synchronization with two pulses of a clamp pulse CLP and a sample pulse SH applied from the control unit 220. In the CDS process, the analog processing unit 207 performs a differential process between a signal level (a reset level) immediately after pixel reset and a true signal level with respect to a pixel signal in a voltage mode, which is input via the vertical signal line 213. In this way, the analog processing unit 207 removes fixed pattern noise (FPN), which is a fixed variation for each unit pixel 203, or reset component which is called a reset noise. The analog processing unit 207 may include an auto gain control (AGC) circuit for amplifying a pixel signal or a configuration for performing other processes as the occasion demands, in addition to a configuration for performing the CDS process.

Figure 20:
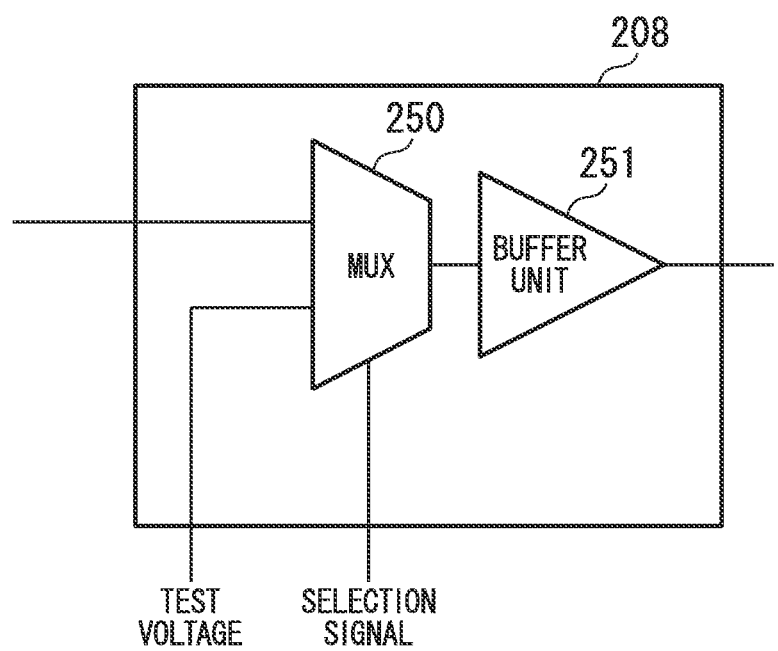
FIG. 20 is a diagram illustrating a configuration example of an input selection unit 208.
Figure 21:
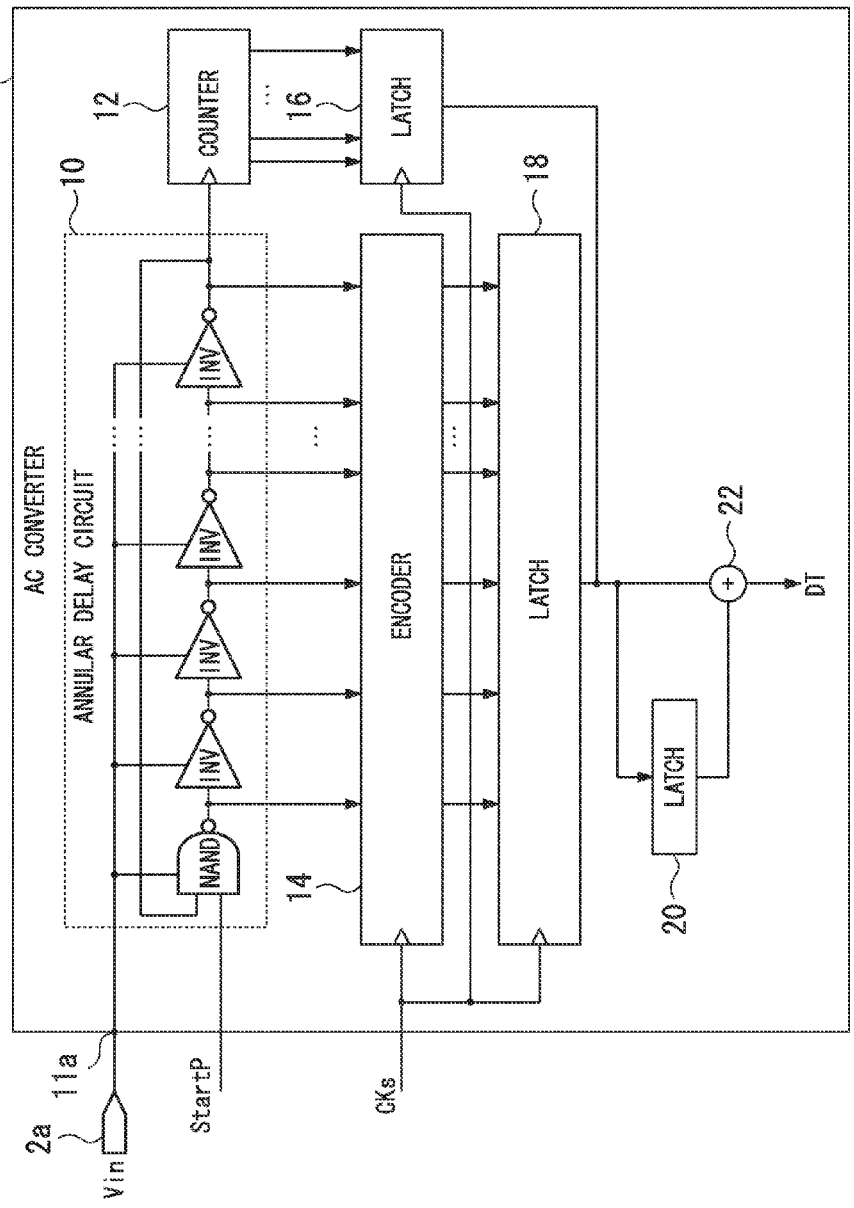
FIG. 21 is a diagram illustrating a configuration of a time AD converter.
Figure 22A:
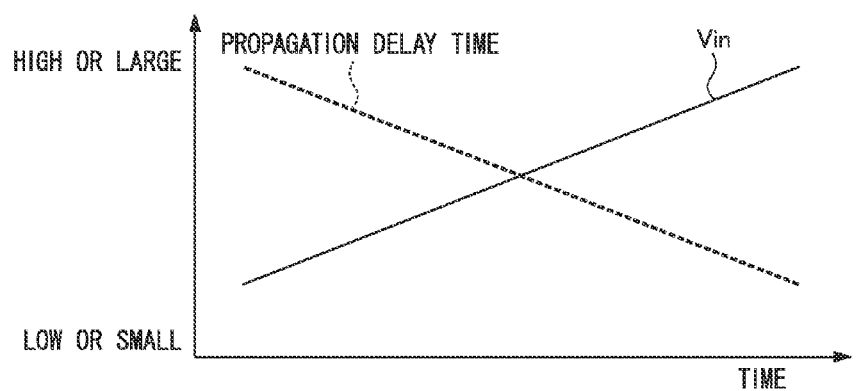
FIG. 22A is a diagram illustrating a change in a propagation delay time according to an analog signal $V_{in}$ in an annular delay circuit 10.
Figure 22B:
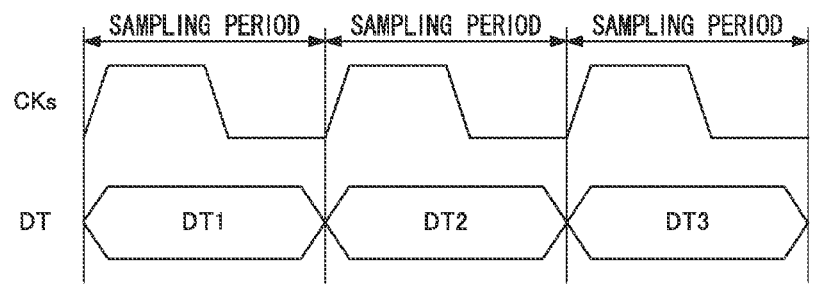
FIG. 22B is a diagram illustrating that an AD converter 3 periodically outputs digital data DT1, DT2, DT3, . . . , based on the clock (CLK) signal CKs.

FIG. 20 is a diagram illustrating a configuration example of an input selection unit 208. The input selection unit 208 includes a MUX 250 and a buffer unit 251. The MUX 250 is a selection unit for switching a signal output from the analog processing unit 207 and a test voltage output from the control unit 220, based on a selection signal (a switching signal) which is output from the control unit 220. Furthermore, an output of the MUX 250 is output to the AD conversion unit 209 after impedance and the like thereof are adjusted by the buffer unit 251.

Each column unit 210 of the AD conversion unit 209 includes an RDL 101, a count part 103, and a memory part 105. The count part 103 corresponds to the digital signal generation unit 102 of the first to fourth preferred embodiments, and counts a count pulse which is output from the RDL 101. The memory part 105 holds a count value which is output from the count part 103. Preferably, a non-synchronous counter circuit, which may be easily controlled, is used as a counter circuit provided in the count part 103. However, a synchronous counter circuit may also be used.

The pixel signal output from each unit pixel 203 is represented by a reference level such as a reset level, and a true signal level superimposed on the reset level. To extract the true signal level from the pixel signal, it is necessary to perform a differential process with respect to the reset level and a signal level with a potential lower than the reset level. Consequently, an "up/down counter" having an "up-count mode" and a "down-count mode" is used in the counter circuit provided in the count part 103, so that the count part 103 can easily perform a differential process.

For example, it is sufficient if the count part 103 performs a count process in the up-count mode when reading the reset level, and performs the count process in the down-count mode when reading the signal level. On the other hand, the count part 103 may perform the count process in the down-count mode when reading the reset level, and perform the count process in the up-count mode when reading the signal level.

Furthermore, the differential process may not be performed by the count part 103, and the "up/down counter" may not be used in the counter circuit provided in the count part 103.

Furthermore, it may be possible to provide a detection part that detects an output signal from each of a plurality of delay units (inversion circuits) provided in the RDL 101, and a memory that holds detected values.

The vertical selection unit 212 and the horizontal selection unit 214 perform a selection operation in synchronization with a driving pulse applied from the control unit 220. Furthermore, various pulse signals for driving each unit pixel 203 are included in the vertical control lines 211a to 211d.

The vertical selection unit 212 includes a vertical shift register (not illustrated) or a decoder (not illustrated), which basically controls a row for reading out a signal. In addition, the vertical selection unit 212 may also include a shift register (not illustrated) or a decoder (not illustrated), which performs row control for an electronic shutter.

In the same manner, the horizontal selection unit 214 includes a horizontal shift register (not illustrated) or a decoder (not illustrated). Furthermore, the horizontal selection unit 214 selects data, which is stored in each column circuit 210 of the AD conversion unit 209, in a predetermined sequence, and outputs selected pixel information to the horizontal signal line 215. In addition, the horizontal signal line 215 is branched and connected to the output unit 217 and the control unit 220 (an RDL control unit 110). In this way, an external environmental signal (pixel information) is input to the control unit 220 (the RDL control unit 110).

The control unit 220 includes the RDL control unit 110 according to the present proposal, a timing generator (TG) (not illustrated), and a communication unit (not illustrated) for communicating with the TG. The TG supplies a clock necessary for the operation of each element or a pulse signal of a predetermined timing.

In addition, the control unit 220 may also be provided as a separate semiconductor integrated circuit, independently of each element of the image capturing unit 202, the vertical selection unit 212, the horizontal selection unit 214 and the like. In this case, a solid-state image pickup device, which is one example of a semiconductor system, is constructed of an image pickup device provided with the image capturing unit 202, the vertical selection unit 212, the horizontal selection unit 214 and the like, and the control unit 220. Furthermore, the solid-state image pickup device may also be provided as an image capturing module in which a peripheral signal process circuit, a power circuit and the like are embedded.

The output unit 217 amplifies the pixel signal of each unit pixel 203, which is output from the image capturing unit 202 via the horizontal signal line 215, with an appropriate gain, and outputs an amplified signal to an external circuit (not illustrated) as an image capturing signal. The output unit 217, for example, performs only buffering. However, the output unit 217 may also perform signal processing such as black level adjustment, column variation correction or color processing, before the buffering. In addition, the output unit 217 may also convert n-bit parallel digital data to serial data and output the serial data. In this case, for example, a multiplication circuit such as a phase-locked loop (PLL) may also be provided in the solid-state image pickup device 201.

As described above, the solid-state image pickup device of the present proposal can easily perform environment correction.

The present invention is not limited to the above embodiments, but may be modified and changed without departing from the scope of the invention.

The present invention, for example, can be applied to a solid-state image pickup device using a time AD converter such as a digital still camera or a video camera.

What is claimed is:

1. A time AD converter comprising:
    an annular delay circuit that includes n delay units (where n is a natural number equal to or larger than 2), wherein each of the n delay units is input a current corresponding to an analog signal;
    a digital signal generation unit configured to generate a digital signal corresponding to the analog signal by using an output of the annular delay circuit; and
    an annular delay circuit control unit configured to be input an external environment signal changing according to a change in external environment, and to control the current, based on the external environmental signal.

2. The time AD converter according to claim 1, wherein the external environmental signal is a count value output from the digital signal generation unit.

3. The time AD converter according to claim 1, wherein the annular delay circuit control unit comprises:
    i current sources (where i is a natural number equal to or larger than 2) corresponding to the analog signal; and
    a current control unit configured to perform control such that outputs of j current sources (where j is a natural number 1 to i) of the i current sources are input to the n delay units based on the external environmental signal.

4. The time AD converter according to claim 1, wherein the annular delay circuit control unit comprises:
    a variable resistor connected in series to the n delay units between an analog signal input terminal and a reference potential terminal; and
    a current control unit configured to control a resistance value of the variable resistor based on the external environmental signal.

5. The time AD converter according to claim 1, wherein the annular delay circuit control unit comprises:
    a variable resistor connected in series to a corresponding delay unit in a one-to-one manner between an analog signal input terminal and a reference potential terminal; and
    a current control unit configured to control a resistance value of the variable resistor based on the external environmental signal.

6. The time AD converter according to claim 1, wherein the annular delay circuit control unit comprises:
    a current control unit configured to input a predetermined voltage to the annular delay circuit, generate the external environmental signal from an output of the annular delay circuit, and control a current flowing through the delay units based on the external environmental signal.

7. A solid-state image pickup device comprising:
    an image capturing unit in which a plurality of pixels each of which outputs a pixel signal according to an amount of incident electromagnetic waves are arranged in a matrix form; and
    a time AD converter according to claim 1, which performs AD-conversion on an analog signal corresponding to the pixel signal.

* * * * *